(12) United States Patent
Kim et al.

(10) Patent No.: US 11,215,932 B2
(45) Date of Patent: Jan. 4, 2022

(54) MARKER LAYOUT METHOD FOR OPTIMIZING OVERLAY ALIGNMENT IN SEMICONDUCTOR DEVICE

(71) Applicants: SK hynix Inc., Icheon (KR); UIF (University Industry Foundation), Yonsei University, Seoul (KR)

(72) Inventors: Sung Jae Kim, Seoul (KR); Song Yi Jeon, Seongnam (KR); Chang Ouk Kim, Seoul (KR); Ki Bum Lee, Seoul (KR)

(73) Assignees: SK hynix Inc., Icheon (KR); UIF (University Industry Foundation), Yonsei University, Seoul (KR)

( * ) Notice: Subject to any disclaimer, the term of this patent is extended or adjusted under 35 U.S.C. 154(b) by 0 days.

(21) Appl. No.: 16/894,700

(22) Filed: Jun. 5, 2020

(65) Prior Publication Data

US 2021/0063895 A1    Mar. 4, 2021

(30) Foreign Application Priority Data

Sep. 3, 2019   (KR) ................ 10-2019-0108778

(51) Int. Cl.
   *G03F 7/20*   (2006.01)
(52) U.S. Cl.
   CPC ...... *G03F 7/70633* (2013.01); *G03F 7/70683* (2013.01)

(58) Field of Classification Search
   CPC ............. G03F 7/70633; G03F 7/70683; G03F 7/70775; G03F 9/7046; G03F 9/7084; H01L 21/682; H01L 21/67282
   See application file for complete search history.

(56) References Cited

U.S. PATENT DOCUMENTS

2019/0243252 A1*   8/2019   Frisco ................ G03F 7/70641

OTHER PUBLICATIONS

Ki Bum Lee et al., "Marker Layout for Optimizing Overlay Alignment in a Photolithography Process", Mar. 27, 2019, 9 pages.
Ki Bum Lee et al., "Particle Swarm Algorithm for the Optimization of Marker Layout in Photolithography Process", Yonsei University, Oct. 8, 2018, 4 pages.

* cited by examiner

*Primary Examiner* — Peter B Kim

(57) ABSTRACT

A method of determining a marker layout for a semiconductor device includes determining the number of markers to be used in a field of a wafer using a first fitness function, calculating a marker probability distribution considering distance information among the markers and determining locations of a marker to be used according to the marker probability distribution, and evaluating performance of a final marker layout by using a second fitness function. The method provides an optimized approach to marker layout, so that the quality of a marker layout may be enhanced. Also, the method generates a marker layout that may minimize a prediction value of an overlay error of experimental wafers and an irregularity of marker locations, so that robust performance may be ensured for the prediction of overlay errors for subsequent new wafers.

12 Claims, 13 Drawing Sheets

MARKER LAYOUT METHOD FOR OPTIMIZING OVERLAY ALIGNMENT IN SEMICONDUCTOR DEVICE

CROSS-REFERENCE TO RELATED APPLICATION

The present disclosure claims priority to and the benefit of Korean Patent Application No. 10-2019-0108778, filed on Sep. 3, 2019, in the Korean Intellectual Property Office, the disclosure of which is incorporated herein by reference in its entirety.

BACKGROUND

1. Field of the Invention

The present disclosure is directed to a marker layout method for optimizing an overlay alignment of a semiconductor device in a photolithography process of a manufacturing process of a semiconductor device.

2. Description of Related Art

A manufacturing process of a wafer in manufacturing processes of a semiconductor device includes a series of processes such as photolithography, deposition, etching, and polishing etc. are repetitively performed.

As these processes are performed, an integrated circuit (IC) is manufactured by continuously laminating patterned layers made of different materials onto a wafer.

In order for the integrated circuit to function properly, when the each layer is laminated on a wafer, a pattern of each layer should be exactly aligned with another pattern on the wafer.

That is, when the patterned layers that are laminated are aligned within an allowed error range, an integrated circuit may operate according to the intent of its designer.

A technology for manufacturing a wafer by laminating dozens of circuit layers together has become increasingly important.

A photolithography process is an essential processes for ensuring that circuit layers are correctly aligned within an allowed error range, and has a critical role related to rate-of-production and profitability.

The photolithography process is the process of transferring a geometric pattern of a mask to a surface of a wafer, and may affect pattern alignment between adjacent layers.

As shown in FIG. 1, in a photolithography process an exposure system of a scanner 10 may project light 20 through a reticle 30 that contains a circuit pattern. The size of the circuit pattern may then be reduced by passing the light 20 through a lens 40, giving shape to a reduced-size image of the circuit pattern on a wafer 60.

Since a size of an exposure field is limited, the scanner 10 repetitively performs a process of projecting the image of the circuit pattern on the wafer 60, moving the image between each repetition. Accordingly, dozens or more of fields 50 having the same image may be formed on one circuit layer.

As semiconductor manufacturing processes have become more and more advanced, overlay control technologies have become important, and among these technologies, an overlay error correction technology to exactly align upper and lower layers of a highly-integrated semiconductor consisting of dozens of layers has become more important.

An overlay error is a dislocation difference between circuit images of a present exposure layer and circuit images of the preceding exposure layer, that is, the dislocation difference among circuit layers in a process in which circuit layers are laminated. Overlay error is one of the main factors affecting a yield rate of a semiconductor product.

To reduce overlay error, an overlay metrology system is applied to enhance pattern alignment precision of the photolithography process. An overlay metrology system measures the relative positions of markers on the wafer, and the metrology results are used to construct a statistical correction model for overlay control so as to more accurately correct an overlay error.

The overlay metrology system may measure overlay errors that are differences between points of the current layer and the corresponding points in the next mask pattern at some points of a wafer. A point that may be used to measure an error is referred to as a marker.

Success or failure of an overlay control is affected by a marker layout, that is, the number and sampling plan of markers in an exposure field of a wafer. Generally, as more markers are allocated on a wafer, an overlay error correction may be more accurate. However, as the number of markers used is increased, turn around time (TAT) of the photolithography process is also extended, so that the process is inefficiently performed.

Therefore, in order to maximize efficiency of the process, a limited number of markers need to be optimally located to enhance an effect of the overlay alignment.

In this case, in order to enhance the effect of the overlay alignment, it is important to improve the quality of the marker layout.

With respect to a process for determining a marker layout, conventional rule-based approaches have mainly used random sampling. Further, a location of a marker has been determined by using specific rules in which markers are evenly distributed on an overall wafer.

In these approaches, even though a plurality of marker layouts that satisfy the above rules exist, a final marker layout is eventually determined randomly, and as a result reliable performance cannot be ensured due to the randomness.

Meanwhile, minimizing the irregularity of the spatial distribution of the markers makes overlay pattern performance among wafers more uniform. Therefore, making the spatial distribution of markers more uniform is an essential factor for achieving robust performance.

That is, a marker layout in which the overall overlay alignment level is optimized only with respect to the currently available experimental wafer data has high probability of being overfitted to that wafer data. In this case, the locations of the markers is set to perform well only as an overlay pattern for the experimental wafer data. The overfitted marker layout may not be optimal for future wafers, so that in actual production stages overlay misalignment may be caused and maximizing the effectiveness of the overlay alignment may be difficult.

Therefore, it is important task for photolithography engineers to find a marker layout achieving a low overlay error among layouts uniformly distributed on a field of a wafer or an overall wafer.

SUMMARY OF THE INVENTION

The present disclosure is for providing a marker layout method to improve quality of a marker layout.

Also, the present disclosure provides a marker layout method for minimizing a predicted value of an overlay error of experimental wafers and an irregularity (nonuniformity) of marker locations.

Also, the present disclosure provides a method of creating a maker layout that may provide both correction performance enhancement of an overlay error and robustness of correction performance at the same time by means of maximizing an effect of overlay correction according to locations among markers.

Objectives of the present disclosure are not limited to the above-described ones. Additionally, other objectives and advantages that have not been mentioned may be clearly understood from the following description and may be more clearly understood from embodiments. Further, it will be understood that the objectives and advantages of the present disclosure may be realized via means and combinations thereof that are described in the appended claims.

A marker layout method of a semiconductor device according to the present disclosure includes determining the number of markers to be used in one field, by using a first fitness function with respect to a wafer including a plurality of fields, calculating a marker probability distribution under consideration of distance information among the markers and determining a location in which the number of the markers, of which use is determined are located in the field, and evaluating performance of a final marker layout by using a second fitness function.

The step of determining the number of markers uses a forward selection (FS) search method that starts with a marker layout of an empty set and picks the best marker one at a time until all of markers are included, wherein the best marker may mean a marker that shows the highest improvement in a first fitness function when each of markers is added to a marker layout of the existing step.

Also, the step of determining the number of markers may use a backward elimination (BE) search method, which starts with a universal set which includes all markers and removes the marker that shows the least impact on the first fitness function one at a time until the marker layout reaches the empty set.

In this case, a first fitness is defined as first fitness=α×SAI(RMSE)+β×SAI(M3S)

wherein α+β=1.

The step of determining a location in which the number of the markers of which use is determined is located in the field continues to select one at a time according to selection probability distribution of markers and generates a final marker layout.

In this case, selection probability distribution of the above markers, in case of selecting a location of a first marker, is determined by an equation of $$p_i = \frac{1}{1+\exp(-x_i)}, \text{ where } 1 \leq i \leq N$$

in order that selection probability of markers is transformed into a value between 0 and 1 within a range of a real number wherein $x_i$ (i=1, ..., N) may be a real number.

Next, in case of selecting a second or a subsequent marker, selection probability of markers is determined by $$\tilde{p}_i = \frac{e^{d_i p_i} - 1}{\sum_{i=1}^{N}(e^{d_i p_i} - 1)}$$

wherein $d_i$ is a minimum value of the distances between the i-th remaining marker and the selected markers.

Quality of a final marker layout determined in a step of determining a location in which the markers are located in the field may be evaluated by performance evaluation index defined as second fitness=α×SAI(RMSE)++β×SAI(M3S)+γ×SAI(irregularity)

wherein irregularity is defined as $$\text{Irregularity} = \frac{1}{n}\sum_{i=1}^{n}(\text{dist}(l_i, n\_l_i))^2$$

and wherein $l_i$ is a marker location (i=1, ..., n), $n\_l_i$ means a location of a nearest neighboring marker in a selected marker set, and α+β+γ=1, RMSE=

$$\sqrt{\frac{1}{n}\sum_{i=1}^{n}(y_i^{res})^2},$$

M3S($y^{res}$)+3σ($y^{res}$), and $$SAI = 1 - \frac{|M_{selected} - M_{full\ sampling}|}{M_{full\ sampling}}$$

are satisfied, wherein $y_i^{res}=y_i-\hat{y}_i$, $y_i$ is an actual overlay value evaluated in marker i, $\hat{y}_i$ is a prediction value at a marker, $y_i^{res}$ is an overlay residual, $M_{selected}$ is a root mean squared error (RMSE) or Mean+3 sigma (M3S) or irregularity which is a measure of an overlay error according to selected markers, and $M_{full\ sampling}$ is a RMSE or M3S or irregularity which is a measure of an overlay error according to full sampling schemes.

The present disclosure provides an optimized approach of a maker layout, so that quality of a marker layout may be enhanced.

Also, the present disclosure generates a marker layout that may minimize a prediction value of an overlay error of experimental wafers and irregularity of marker locations, so that robust performance may be ensured in respect of prediction of an overlay error with respect to subsequent new wafers.

Also, a spare particle swarm optimization (SPSO) algorithm method according to the present disclosure presents a potential solution considering sparsity of markers, and may derive that a search for particles due to the above ensures correction performance of an overlay error and locational uniformity of markers.

In addition to the above effects, specific effects of the present disclosure are described together with explaining specific matters for implementing an embodiment hereinafter.

DETAILED DESCRIPTION

Figure 1:
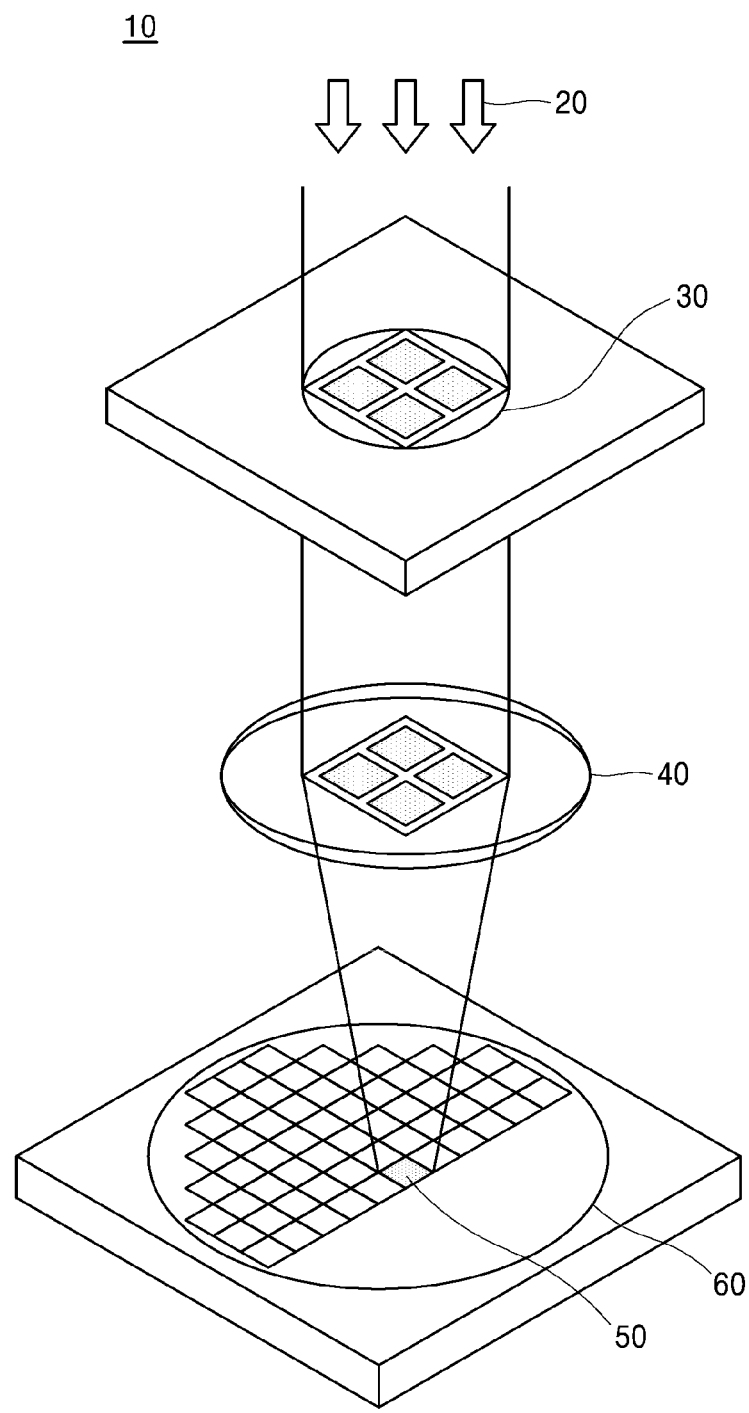
FIG. 1 illustrates an exposure process.

The previously-described objectives, features and advantages will be described specifically hereinafter referring to the attached drawings, so that those skilled in the art can easily realize the technical gist of the present disclosure. In describing the disclosure, detailed description of known technologies in relation to the disclosure is omitted if it is deemed to obscure the gist of the present disclosure. Hereinafter, referring to the attached drawings, an embodiment according to the present disclosure is explained specifically. Throughout the drawings, identical reference numerals denote identical or similar components.

In a photolithography process of wafer manufacturing steps, a respective mask pattern is transferred onto a wafer according to a layer. A procedure of exactly aligning a pattern among adjacent layers is an essential procedure that affects wafer yield.

In order to enhance accuracy of a pattern alignment, an overlay alignment process is performed in which an overlay metrology system measures an overlay error for some of markers on a wafer, and the measured error information is used to establish an overlay correction model.

Depending on which marker layout is used in the overlay alignment process, the amount by which an overlay error is corrected may vary, and therefore optimizing a marker layout according to a layer is important.

In order to optimize a marker layout, the number of markers to use and a location selection for those markers are considered.

In an embodiment, the maximum number of usable markers is determined according to the required quality and processing time of an installation, and locations of markers are selected in order that an overlay correction model that is established according to overlay error information shows a robust performance in a subsequent wafer manufacturing process.

Figure 2:
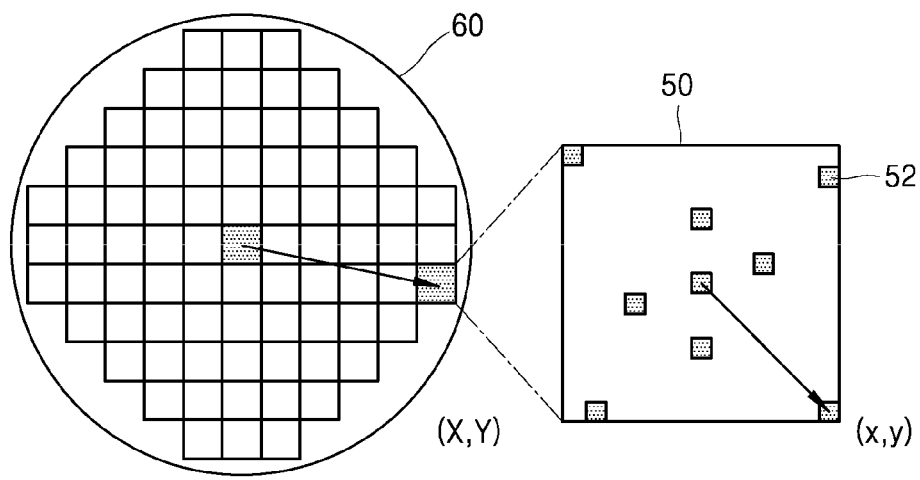
FIG. 2 illustrates a coordinate system of a field and a marker.

FIG. 2 shows an example of field coordinates and marker coordinates.

In order to correct an overlay error, the overlay error is corrected by overlay marker coordinates of a wafer wherein the overlay marker coordinates includes field coordinates and marker coordinates.

Markers used for measuring overlay errors are provided at several parts of a wafer wherein coordinates thereof are defined as follows.

Field coordinates are defined by a distance between a center of a wafer 60 and a center of a field 50, meaning a center location of the relevant field 50 to which a marker 52 belongs from a center of the wafer 60, and are indicated as Y) coordinates.

Marker coordinates are defined by a distance from a center of the field 50 in which the marker 52 is located, represent a location of the overlay marker 52 relative to the center of the field 50, and are indicated as (x, y) coordinates.

Therefore, marker coordinates from a center of a wafer are indicated as (X+x, Y+y).

The present disclosure provides a sparse particle swarm optimization (SPSO) algorithm method for finding an optimal marker layout that is robust in respect to 1) prediction of an overlay error and 2) irregularity of marker locations.

Specifically, an overall process of the sparse particle swarm optimization (SPSO) algorithm method according to the present disclosure may consist of two steps as follows so as to optimize a marker layout.

A first step is to determine the number of markers used in one field among the total available markers.

The total number of markers available in one field varies depending on a layer, but it is preferable that the number of sampling markers (that is, the number of markers actually used to correct overlay error) should be the same in an overall process (that is, for each layer) so as to maintain consistent turn around time (TAT) for a process.

A second step is to determine locations of the sampling markers.

Once the number of sampling markers is determined, determination of a marker layout may be considered as a problem of combinatorial optimization.

Hereinafter, in order to find an optimal marker layout with respect to each layer according to the present disclosure, several algorithms are applied and quality of a marker layout is quantitatively compared using a fitness function.

Also, in the case of experimental examples to be explained hereinafter, with respect to data collected from three different layers as a test subject, performance of marker layouts obtained by applying an algorithm according to the present disclosure and the search algorithms of the related arts are compared to demonstrate the performance of the algorithm according to the present disclosure. The comparison uses overlay measurement data from a total of 118 total wafers (two wafers per lot) containing information of three different layers. Information of Layer A was obtained from 40 wafers having 124 markers per field, information of layer B from 38 wafers having 115 markers per field, and information of layer C from 40 wafers having 121 markers per field. Each wafers had up to 118 fields with evenly-spaced markers in a 2×1 marker array, and each marker had location information and overlay error measurements.

If a new marker layout is given by a search algorithm, the intrafield high-order process correction model is trained using the overlay errors measured at the markers so as to correct the overlay error.

Hereinafter, a marker layout determination process for optimizing the overlay alignment of a semiconductor device according to embodiments of the present disclosure is specifically described.

Step 1: Searching for the Optimal Number of Markers Per Field (1) Search Algorithm A. Efficiency Performance Measurement of Marker Layout Sampling According to the present disclosure, in order to evaluate efficiency of a marker layout, a root mean squared error (RMSE) and Mean+3 sigma (M3S) were used as performance measures, wherein RMSE and M3S are defined as follows.

$$RMSE = \sqrt{\frac{1}{n}\sum_{i=1}^{n}(y_i^{res})^2} \quad \text{Equation 1}$$

$$M3S = \text{Mean}(y^{res}) + 3\sigma(y^{res}) \quad \text{Equation 2}$$

$$y_i^{res} = y_i - \hat{y}_i \quad \text{Equation 3}$$

Here, $y_i$ is an actual overlay value, that is, an overlay error evaluated at marker i. $\hat{y}_i$ is a prediction value at the marker i and $y_i^{res}$ is an overlay residual of the marker i. $\text{Mean}(y^{res})$ is the average of the overlay residuals $y_i^{res}$ for i in 1 ... n, $\sigma(y^{res})$ is the standard deviation of the overlay residuals $y_i^{res}$ for i in 1 ... n.

Next, a sampling accuracy indicator (SAI) in which RMSE and M3S are normalized in consideration of the mutually different scales of RMSE and M3S is defined as follows.

$$SAI = 1 - \frac{|M_{selected} - M_{full\ sampling}|}{M_{full\ sampling}} \quad \text{Equation 4}$$

$M_{selected}$ represents a measure of an overlay error according to selected markers, that is, RMSE or M3S or irregularity, and $M_{full\ sampling}$ represents a measure of an overlay error according to full sampling schemes, that is, RMSE or M3S or irregularity.

$$\left(\text{E.g.: } SAI(RMSE_{selected}) = 1 - \frac{|RMSE_{selected} - RMSE_{full\_sampling}|}{RMSE_{full\_sampling}}\right)$$

Generally, if the number of sampling markers increases, performance of a marker layout may be also improved.

$M_{full\ sampling}$ represents the best performance, that is, $M_{full\ sampling}$ means an ideal value of a measure in the case where all available markers are used.

$M_{selected}$ represents a present measure in the case where only selected markers are used.

SAI indicates the degree to which $M_{selected}$ approximates to $M_{full\ sampling}$. The SAI value approaches 1 as $M_{selected}$ approaches $M_{full\ sampling}$.

B. Determination of the Proper Number of Markers in One Field

For an illustrative product that may be a subject of the present disclosure, the number of sampling markers that may be used in one field may be from 10 or more to 30 or less, wherein the lowest and highest limits may be changed according to a circumstance of a production line of the subject product.

The low limit on the number of these markers is determined by quality of overlay control required, and the high limit on the number of markers is determined by a required turn around time (TAT) of the photolithography process.

If the number of markers is too few, the amount of overlay error information provided may be insufficient to construct an effective overlay correction model. This may reduce robustness of a parameter of a correction model, so that reliability problems with respect to an overall photolithography process may be caused.

If the number of marker is too many, TAT is extended, so that productivity of a process may be consequently lowered.

The number of markers generally used in a production line may be arbitrarily decided within a range of the low and high limits by consultation with expert groups.

However, the present disclosure presents a scientific investigation of a relationship between the number of markers and overlay control quality, and an the optimal number of markers that was obtained as a result.

Specifically, in order to confirm performance of an overlay correction model according to the number of sampling markers of a field of a wafer, the investigation used a forward selection (FS) search and a backward elimination (BE) search.

FS starts with a marker layout of an empty set and selects an optimal marker one at a time in a series of steps until all of the markers are included in the set.

Here, the optimal marker means a marker that shows the highest improvement in a first fitness function defined in equation 5 when each of markers is added to the marker layout during the current step.

$$\text{Fitness} = \alpha \times SAI(RMSE) + \beta \times SAI(M3S) \quad \text{Equation 5}$$

Here, the first fitness function includes a measure of RMSE and M3S adjusted by SAI. In an embodiment presented in the present disclosure, RMSE and M3S have the same importance in terms of overlay control, so that $\alpha$ and $\beta$ are set to be 0.5, but embodiments are not limited thereto.

BE starts with a universal set including all markers and removes the marker that shows the least impact on the fitness defined in Equation 5, that is, is the most unimportant, one at a time until a marker layout reaches an empty set.

Both FS and BE may rapidly and efficiently produce approximately optimal solutions for all possible numbers of sampling markers.

Figure 4A:
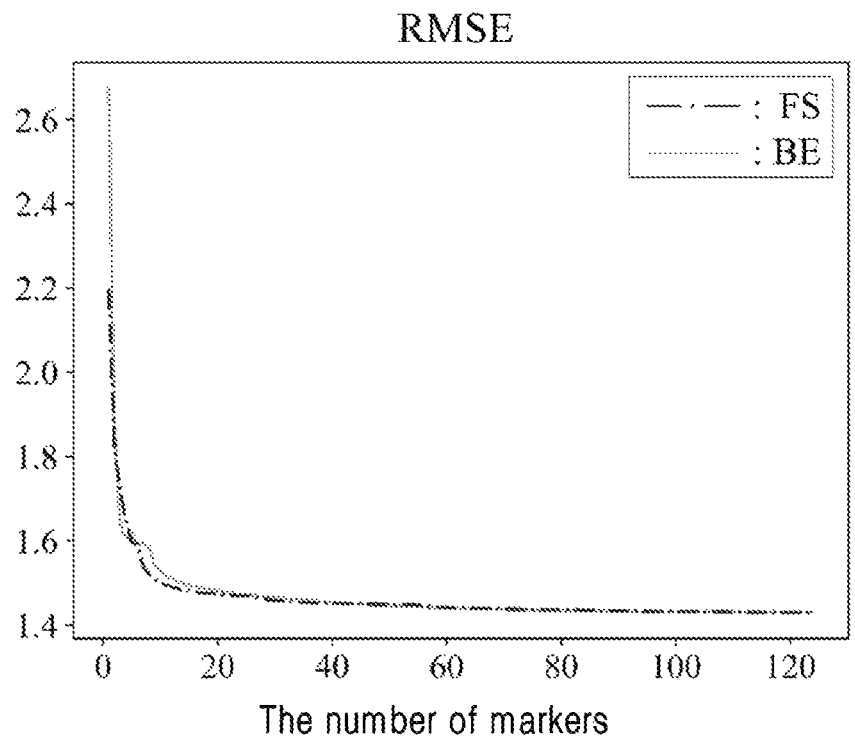
FIGS. 4A and 4B show result values for Root Mean Square Error (RSME) and Mean+3 Sigma (M3S), respectively, for a number of markers selected using a Forward Selection (FS) and a Backward Elimination (BE) search with respect to layer A.
Figure 4B:
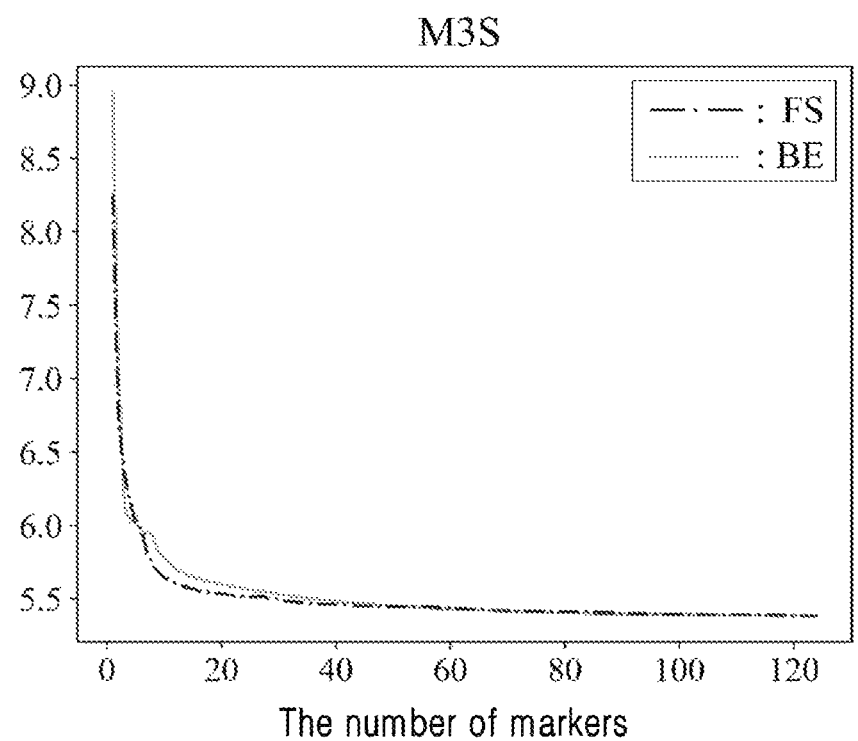

Result values for RSME and M3S, respectively, for numbers of sampling markers selected using each of FS and BE with respect to layer A are shown in FIGS. 4A and 4B.

Referring to FIGS. 4A and 4B, it may be confirmed that both RMSE and M3S of an overlay correction model were rapidly decreased until 10 markers were used, and then performance improvement gradually slows down, so that quality gradually converges.

Also, it may be confirmed that the graphs of RMSE and M3S are both decrease monotonically as the number of markers used increases.

These results demonstrate that to maximize performance of an overlay correction model, using all of available markers is ideal, but relatively robust model parameters may be obtained using as few as 10 markers.

If a search for minimizing each of RMSE and M3S is performed, a solution set given as a result thereof is optimized to each of those fitness functions.

If markers selected in the search of the above RMSE and M3S are the same, these selected markers may be directly used as a final marker layout in the equipment.

However, if a search result based on RMSE and the search result based on M3S are different, then additional steps for determining a single solution considering both RMSE and M3S may be needed. Accordingly, the present disclosure overcomes this problem by using a first fitness function such as disclosed in Equation 5 that combines RMSE and M3S into a single fitness function.

(1) Objective Function

The present disclosure provides an objective function that combines a measure of RMSE and M3S into a single first fitness function disclosed as Equation 5, above.

Here, the first fitness function includes a measure of RMSE and M3S adjusted by SAI, wherein α and β are weights of each component composing a first fitness function and α+β=1.

In an embodiment, RMSE and M3S have the same importance in overlay control, so that α and β are set to be 0.5.

2. Search Methodology for an Optimal Marker Layout Per Field (1) Search Algorithm A. Principle of Particle Swarm Optimization (PSO)

A particle swarm optimization (PSO) algorithm is a population-based metaheuristic that emulates a swarm of flocking birds.

This algorithm may be widely applied to a lot of optimization problems in the manufacturing field due to its simple configuration and excellent performance.

In PSO, particle swarm searches a promising region in a solution space.

Particularly, each of particles of a swarm represents a potential solution, and performs a stochastic search, moving

TABLE 1

| Number of markers | Layer A | | | | Layer B | | | | Layer C | | | |
|---|---|---|---|---|---|---|---|---|---|---|---|---|
| | SAI(RMSE) | | SAI(M3S) | | SAI(RMSE) | | SAI(M3S) | | SAI(RMSE) | | SAI(M3S) | |
| | FS | BE | FS | BE | FS | BE | FS | BE | FS | BE | FS | BE |
| 1 | 46.4% | 13.1% | 46.7% | 33.8% | −30.8% | −49.3% | −14.2% | −23.0% | −181% | −237% | −146% | −165% |
| 10 | 95.1% | 93.3% | 95.2% | 92.9% | 91.4% | 89.8% | 91.5% | 89.7% | 92.8% | 95.5% | 93.3% | 95.7% |
| 15 | 96.5% | 95.5% | 96.6% | 95.1% | 93.9% | 92.8% | 94.3% | 93.2% | 95.8% | 96.8% | 96.1% | 96.9% |
| 18 | 96.9% | 96.1% | 97.1% | 95.7% | 94.8% | 93.9% | 95.1% | 94.3% | 96.3% | 97.1% | 96.6% | 97.2% |
| 20 | 97.0% | 96.4% | 97.3% | 96.0% | 95.5% | 94.7% | 95.7% | 94.9% | 96.5% | 97.2% | 96.8% | 97.6% |
| 25 | 97.3% | 97.1% | 97.6% | 96.7% | 96.3% | 96.2% | 96.6% | 96.3% | 96.7% | 97.8% | 97.1% | 98.1% |
| 30 | 98.0% | 97.5% | 98.0% | 97.3% | 96.8% | 97.2% | 97.2% | 97.2% | 98.2% | 98.3% | 98.2% | 98.5% |
| 100 | 99.9% | 99.9% | 99.9% | 99.9% | 99.2% | 99.9% | 99.3% | 99.9% | 99.9% | 99.9% | 99.9% | 99.9% |
| Full | 1.431 | | 5.385 | | 3.638 | | 13.629 | | 2.659 | | 10.053 | |

Table 1 shows SAI performance result values for each number of mutually different sampling markers obtained by searching using the FS and BE methods, using the first fitness function defined in Equation 5 and for each of layers A, B, and C. In Table 1, RMSE and M3S with respect to each layer are indicated as percentage with respect to SAI.

The last line (Full) of the table presents real RMSE and M3S values of a model using overall overlay information collected by utilizing all the markers.

When just one marker is used, a negative value (−) was measured in layers B and C, and these values represent overlay errors that were exacerbated due to the incomplete model established by insufficient information.

As the number of markers is increased, layers A and C showed similar performance improvements to about 95% of the Full value with 10 markers, about 97% with 20 markers, and about 98% with 30 markers.

In contrast, layer B performance improved to 91% of the Full value with 10 markers, 95% with 20 markers, and 97% with 30 markers, so that overlay errors were somewhat larger for Layer B than for Layers A or C.

Because the performance differed depending on a type of a layer, in an embodiment the layer showing the worst performance should be selected as the criterion for a minimum quality reference of the overall photolithography process.

Therefore, the number of markers ensuring about 95% of Full performance was determined to be 18 based on the results for the layer B.

Although selecting 20 markers enhanced the performance for layer B slightly more, a 20 marker layout was not efficient in regard to TAT and the other layers, so it was determined that it was preferable that 18 markers finally ensuring about 95% of Full performance should be selected.

each particle to a new potential solution from iteration to iteration according to Equations 6 and 7 as follows.

$$X_k^{t+1} = X_k^t + V_k^t \qquad \text{Equation 6}$$

$$V_k^t = w V_k^{t-1} + c_1 r_1 (p_k^t - X_k^t) + c_2 r_2 (p_g^t - X_k^t) \qquad \text{Equation 7}$$

Here, $X_t^k$ denotes a position of particle k at a $t^{th}$ iteration, $V_k^t$ denotes a moving direction (velocity) of a particle for the next iteration, w is an inertia factor, $c_1$ and $c_2$ are two positive constants referred as cognitive and social learning rates, and $r_1$ and $r_2$ are uniformly distributed random numbers in a range of 0 to 1, respectively.

In each iteration, the velocity of each particle is updated based on its velocity in the previous iteration $V_k^{t-1}$, a local best solution $p_k^t$, and a global best solution $p_g^t$.

$p_k^t$ is the best solution of particle k from its own experience. The experience means a fitness value of a potential solution that the particle has found so far.

$p_g^t$ is the best solution of all particles from global experience, which attracts the other particles to move toward itself, helping them search for a more plausible space.

In Equations 6 and 7, performance of each particle is evaluated using a fitness function and this procedure is repeated until the PSO iteration count t reaches the maximum iteration T.

Then, PSO selects a final value of $p_g^T$ as an optimal solution.

In the PSO algorithm, w is a critical parameter for controlling a speed and a search direction of the particle swarm. A large value of w increases the global exploration of the particle swarm, keeping each particle at its own speed and direction. On the contrary, a small value of w increases the local exploration of the particle swarm, making each particle converge quickly to the local optima as greatly influenced by the existing experience ($p_k^t$, $p_g^t$).

In order to balance a global exploration and a local exploration, in embodiments of the present disclosure, a value of w is dynamically varied as the value is repeatedly used.

$$w = w_{max} - \frac{w_{max} - w_{min}}{iteration_{max}} \times iteration \qquad \text{Equation 8}$$

In Equation 8, w is linearly decreased from $w_{max}$ to $w_{min}$, and this decrease leads to the velocity of a particle gradually decreasing as the number of iterations performed increases.

Therefore, the particle swarm actively explores the solution space in the early stage of the search and exploits only the most promising areas in the last stage of the search.

B. PSO Overlay Sampling

Overlay sampling is a combinatorial optimization problem where only M critical markers (that is, markers to be used as sampling markers) are selected among all N feasible markers (M<N), which can maximize the performance of the overlay correction model.

In PSO for overlay sampling, each of the particles represents a potential solution, that is, a marker layout, of a N-dimensional vector $X=(x_1, x_2, \ldots, x_N)$, wherein each element $x_i$ ($i=1, \ldots, N$) is a real number corresponding to an $i^{th}$ feasible marker.

Each element may have a value of 1 or 0 in order to indicate whether the corresponding marker is selected, and a marker layout has M elements of value one to represent M selected markers.

At each PSO iteration, each element is assigned a value greater than or equal to 0 and less than or equal to 1 by transforming each original PSO solution element $x_i$ into a logistic function value $p_i$ using Equation 9, below.

$$p_i = \frac{1}{1 + \exp(-x_i)}, \text{ where } 1 \leq i \leq N \qquad \text{Equation 9}$$

Thereafter, a feasible marker layout may be obtained by the probabilistic selection of M markers using probability distribution defined in Equation 9.

Here, the higher the selection probability of a marker is, the greater the contribution of the marker to a fitness function of an overlay sampling problem.

However, stochastically, when a marker is selected, it is not always a marker with a high contribution, and in some cases a marker with a low contribution may be selected. Based on this property, PSO may escape from local optima during the process of searching a solution space.

C. Sparse Particle Swarm Optimization Algorithm

A sparse particle swarm optimization (SPSO) algorithm according to the present disclosure is different from PSO, in that SPSO updates marker probability distributions by considering distance information between markers.

First, SPSO assumes an initial probability distribution of the markers at each PSO iteration.

Thereafter, SPSO selects only one marker at a time and selects the first marker in the same method as that of the existing PSO. That is, a first marker is determined using Equation 9.

However, for selection of a second or subsequent marker, the probability distribution of the remaining (as yet unselected) markers is updated according to the selected markers such as by using Equation 10.

$$\tilde{p}_i = \frac{e^{d_i p_i} - 1}{\sum_{i=1}^{N}(e^{d_i p_i} - 1)} \qquad \text{Equation 10}$$

In Equation 10, $\tilde{p}_i$ is the selection probability of the $i^{th}$ remaining marker calculated by the softmax function with a weight $d_i$. $d_i$ is a minimum value of the distances between the $i^{th}$ remaining marker and the selected markers.

The softmax function has a feature in that all of its outputs are probability values between 0 and 1 regardless of the sizes of the input values, and a total sum of these outputs is always to be 1. In embodiments of the present disclosure, the softmax function adjusts the selection probability $p_i$ of the $i^{th}$ unselected marker in consideration of a minimum distance $d_i$ between the $i^{th}$ remaining marker and the selected marker nearest to the $i^{th}$ remaining marker, so that the selection probability $p_i$ of unselected markers that are farther away from the already-selected markers are amplified, thereby outputting $\tilde{p}_i$.

A value of $d_i$ being larger indicates that the $i^{th}$ marker is farther away from the selected markers. According to Equation 10, as a value of $d_i$ becomes large, the probability that the corresponding unselected marker i will be selected becomes high.

Therefore, if the marker having a large value of $d_i$ is selected, a marker layout that may measure an overlay error of a new wafer area may be produced. As a result, SPSO may generate a more promising potential solution considering the sparsity of the markers.

Although most of softmax functions use the form $e^x/\Sigma e^x$, Equation 10 of an embodiment of the SPSO adds −1 to the exponent term "x" so that already-selected markers have a selection probability of zero.

Figure 3A:
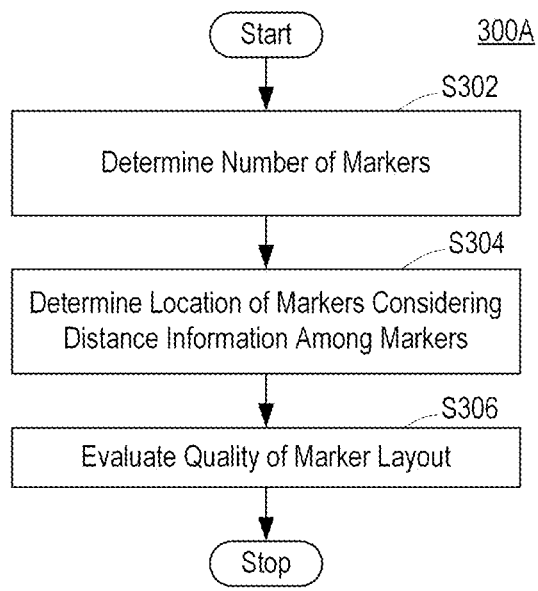
FIG. 3A illustrates a marker layout process according to an embodiment of the present disclosure.
Figures 3B, 3C:
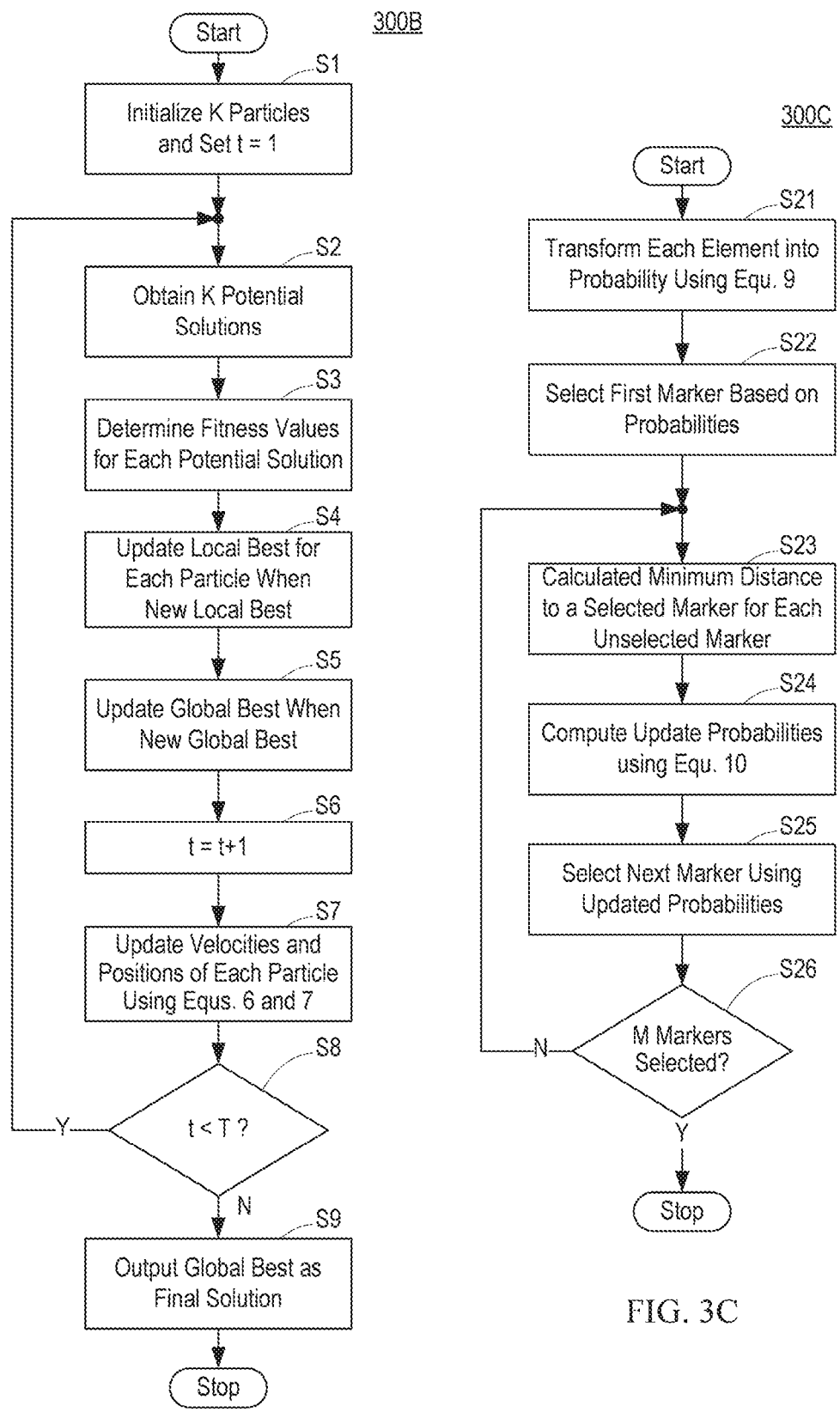
FIG. 3B illustrates a marker layout process that may be used in the marker layout process of FIG. 3A, according to an embodiment of the present disclosure.
FIG. 3C illustrates a process for determining potential solutions for a marker layout process according to an embodiment.

In an embodiment, a procedure of SPSO according to the present disclosure for solving an overlay sampling problem proceeds as shown in FIGS. 3A, 3B, and 3C.

In the process 300A shown in FIG. 3A, at S302 a number M of sampling markers to be used is determined, as discussed above.

At S304, locations of M markers to be used for sampling are determined taking into account the distances between the markers.

At S306, the quality of the marker layout comprising the selected markers is evaluated.

Performing the process 300A of FIG. 3A may include performing the process 300B shown in FIG. 3B, as follows:

At S1, K particles are initialized in a range of 0 to 1, and the number of iterations t is set to 1.

At S2, obtain K potential solutions by performing the process 300C shown in FIG. 3C for each of the initial K particles, as follows:

At S21, apply Equation 9 to each element $x_i$, i in 1 ... N, of a particle to obtain a marker selection probability $p_i$, where N is the total number of markers.

At S22, select a first marker according to the probability distribution of the marker selection probabilities $p_i$, i in 1 ... N.

At S23, determine a minimum distance between each of the remaining markers that are not selected and the selected markers.

At S24, determine an updated probability for each of the remaining markers according to Equation 10.

At S25, select the next marker from among the unselected markers according to the updated probability distribution.

At S26, when the number of markers selected is less than the desired number M of selected markers, return to S23. Accordingly, steps S23 to S25 are repeated until M markers are selected.

The selected M markers are indicated as a potential solution of the relevant particle for the $t^{th}$ iteration.

At S3, determine a fitness value of each of the K potential solutions respectively corresponding to the K particles.

At S4, for each particle, if its new potential solution exhibits better performance than its previous best potential solution, update a local best solution $p_k^t$ of the particle to reflect the new potential solution.

At S5, if a new potential solution of any of the particles exhibits better performance with respect to all particles, update a global best solution $p_g^t$ to reflect that new potential solution.

At S6, change the number of iterations t to t+1.

At S7, update the velocity and position information of all the particles using Equations 6 and 7. In an embodiment, the value of w used in Equation 7 is determined using Equation 8.

At S8, determine whether the number of iterations t performed is less than a target number T of iterations, and if it is return to S2. Accordingly, S2 to S7 are repeated until the number of iterations t reaches T.

At S9, output the global best solution $p_g^T$ as a final best solution.

(2) Objective Function

In experimental examples hereinafter, quality of marker layouts found by SPSO according to the present disclosure and the other search algorithms, specifically, a baseline algorithm, FS, BE, genetic algorithm (GA), and PSO etc. are compared.

FS and BE algorithms were performed in the same manner as in the experiment previously described.

The baseline algorithm determines a marker layout by considering the spatial symmetry and uniformity of markers, which are common properties of heuristic reasoning suggested in rule-based studies.

With respect to a parameter of GA, the number of search groups was selected as 100, the number of iterations was selected as 300, a crossing rate was selected as 80%, and a mutation rate was selected as 3%.

For the PSO and SPSO algorithms, the number of particles was set to be 100, the number of iterations was set to be 300, $w_{max}$ and $w_{min}$ were set to be 0.9 and 0.4, respectively, and $c_1$ and $c_2$ were set to a value of 2.

Further, a reference with respect to irregularity that is an objective function related to an optimal marker layout per field is used that calculates an average minimum distance between total usable potential markers and the selected markers, such as Equation 11 below.

$$\text{Irregularity} = \frac{1}{n}\sum_{i=1}^{n}(\text{dist}(l_i, n\_l_i))^2 \qquad \text{Equation 11}$$

Here, $l_i$ is a marker location (i=1, ..., n), and $n\_l_i$ means a location of the nearest neighboring marker in the selected marker set.

Irregularity measures the degree to which the selected markers in a layout were evenly distributed in order to effectively extract the overlay error over the overall wafer.

If the markers were spread evenly throughout the field, the irregularity value would be low, but if some markers were densely located in a certain field area, this value would become high.

A high level of irregularity in a marker layout indicated that the layout might have risks of overfitting to the current data and showing unstable performance when implemented in the actual production stage.

To give a penalty to such marker layouts, the irregularity measure with respect to a marker layout is included in a second fitness function defined in Equation 12.

$$\text{Fitness} = \alpha \times \text{SAI(RMSE)} + \beta \times \text{SAI(M3S)} + \gamma \times \text{SAI(irregularity)} \qquad \text{Equation 12}$$

Here, $\alpha$, $\beta$, $\gamma$ are weights of each of components composing the second fitness function wherein $\alpha+\beta+\gamma=1$ is satisfied.

Figure 5A:
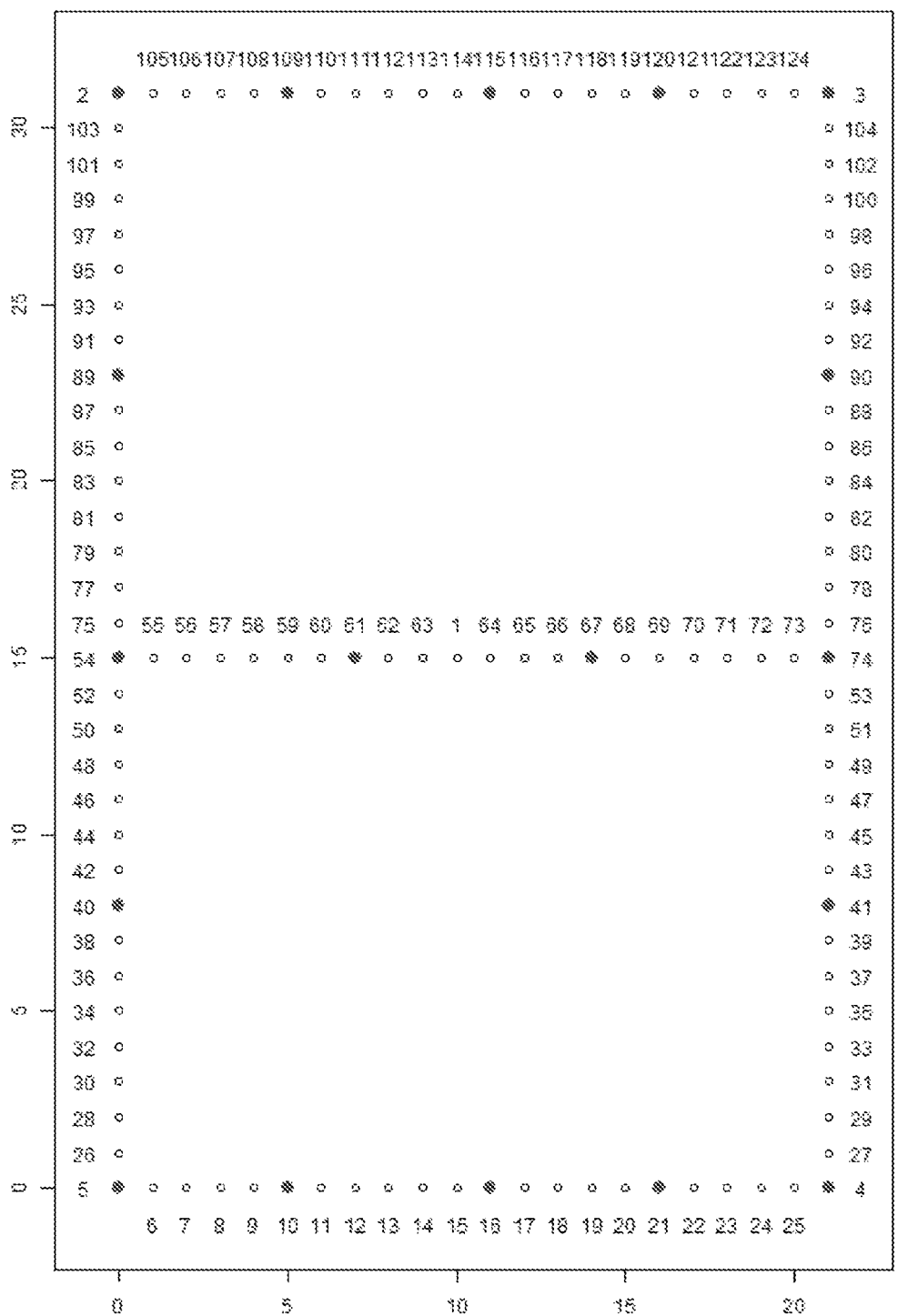
FIGS. 5A to 5C show a baseline marker layout of layers A, B, and C, respectively.
Figure 5B:
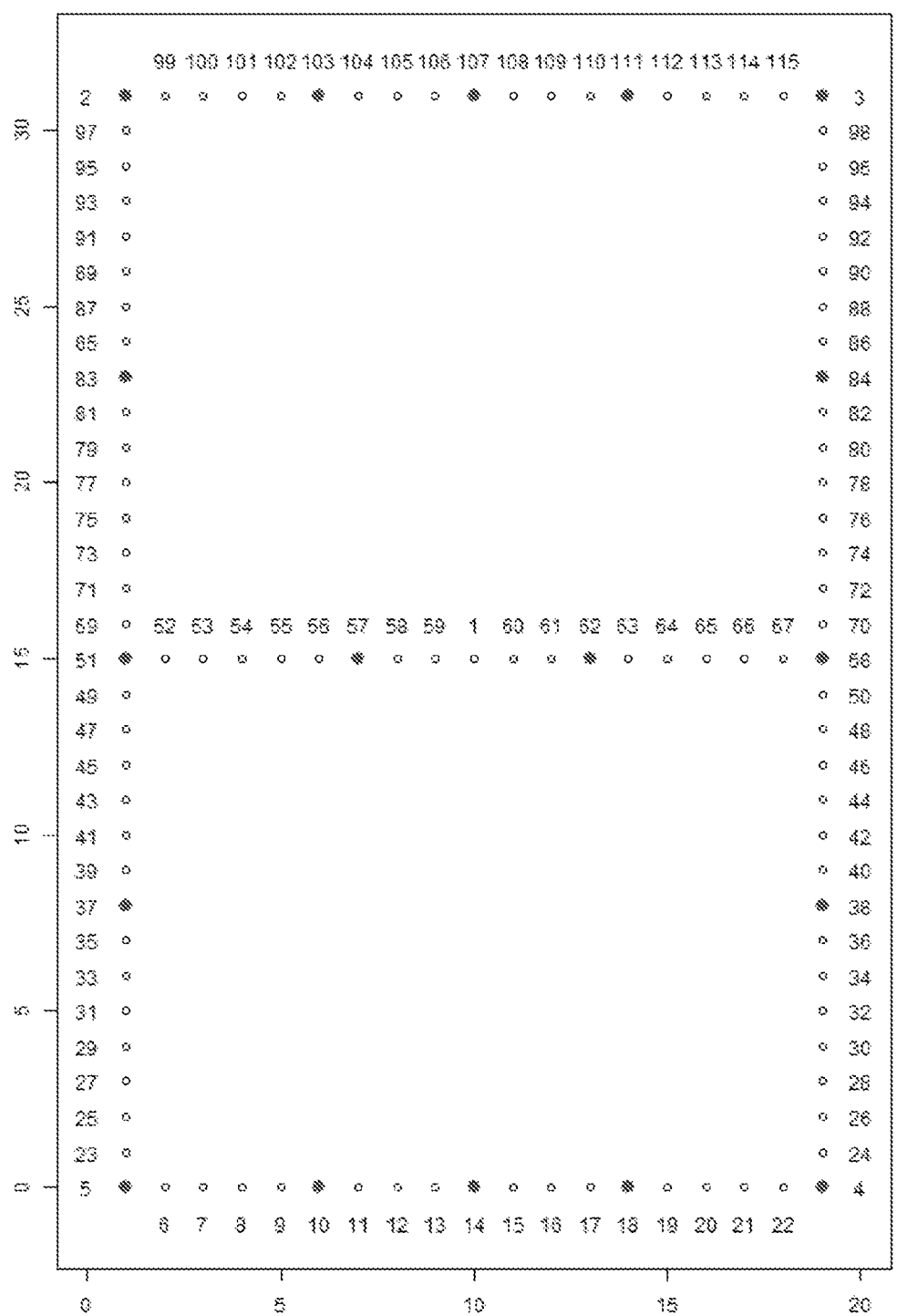
Figure 5C:
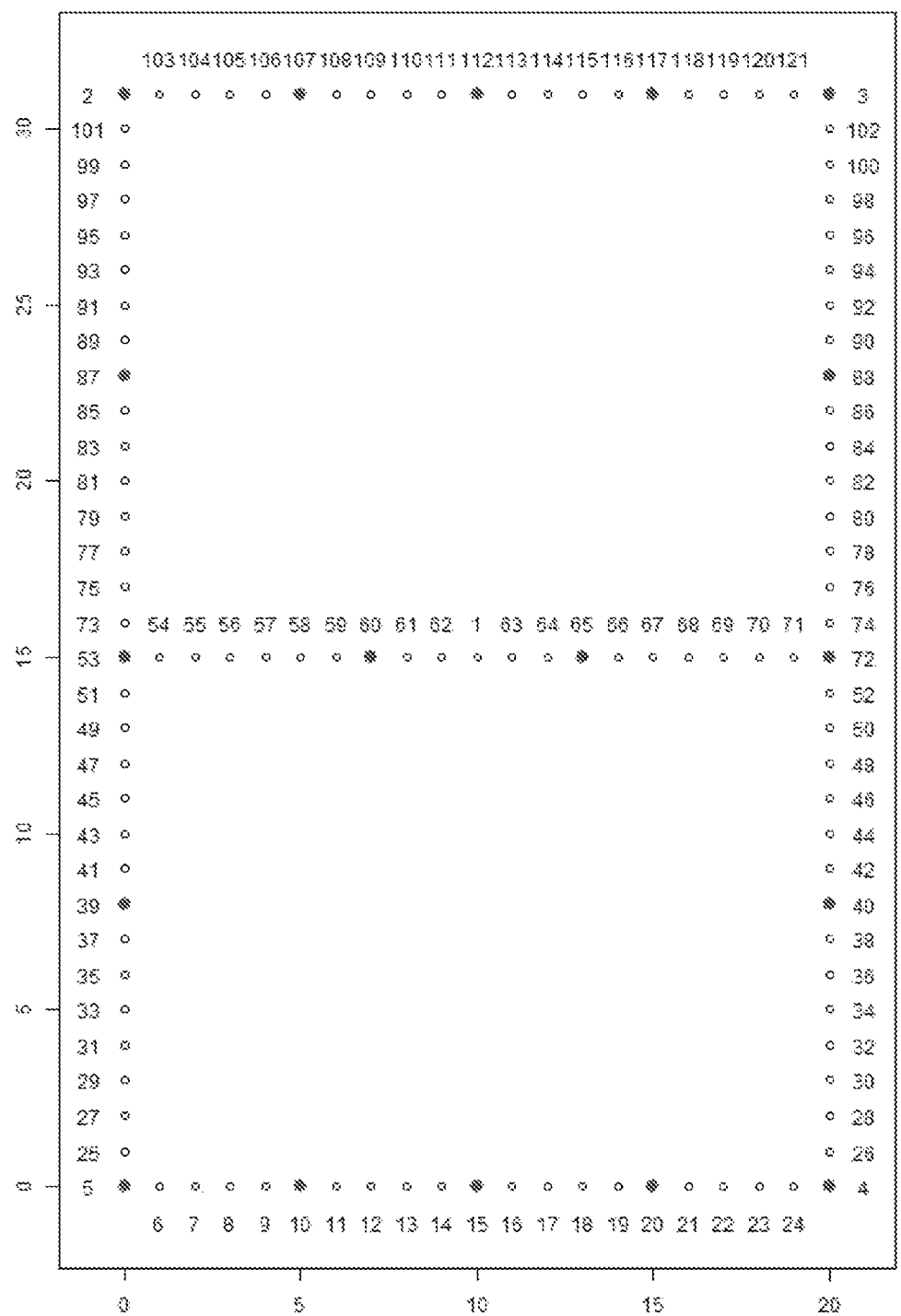

A baseline marker layout for layers A, B, and C are shown in FIGS. 5A, 5B, and 5C, respectively.

The number of maximum usable markers for each of the layers varied from 115 to 124, so that an absolute location of markers is somewhat different according to the layer.

Considering the density of the markers, a baseline layout was determined according to the following rules. First of all, 6 markers at each corner were selected. Thereafter, five markers were arranged by equal intervals on both a vertical axis and a horizontal axis. Finally, the remaining two markers were located on a centerline.

TABLE 2

| Layer | Algorithm | RMSE X | RMSE Y | M3S X | M3S Y | RMSE ratio | M3S ratio | Irregularity | Fitness |
|---|---|---|---|---|---|---|---|---|---|
| A | Baseline | 0.718 | 0.744 | 2.706 | 2.813 | — | — | 4.736 | 96.37% |
| | SPSO | 0.711 | 0.742 | 2.679 | 2.775 | 0.52% | 1.17% | 4.660 | 97.16% |
| | FS | 0.713 | 0.741 | 2.684 | 2.772 | 0.51% | 1.13% | 6.009 | 94.45% |
| | BE | 0.722 | 0.744 | 2.720 | 2.800 | −0.35% | −0.02% | 5.160 | 95.30% |
| | GA | 0.722 | 0.747 | 2.724 | 2.813 | −0.54% | −0.32% | 6.000 | 93.29% |
| | PSO | 0.716 | 0.741 | 2.695 | 2.792 | 0.33% | 0.56% | 6.311 | 93.46% |
| B | Baseline | 1.898 | 2.271 | 7.134 | 8.535 | — | — | 4.546 | 94.80% |
| | SPSO | 1.887 | 2.245 | 7.028 | 8.421 | 0.88% | 1.40% | 4.763 | 95.41% |
| | FS | 1.895 | 2.224 | 7.038 | 8.341 | 1.20% | 1.85% | 10.742 | 86.25% |
| | BE | 1.906 | 2.281 | 7.137 | 8.549 | −0.43% | −0.11% | 5.082 | 93.36% |
| | GA | 1.922 | 2.298 | 7.094 | 8.655 | −1.22% | −0.51% | 4.814 | 93.39% |
| | PSO | 1.896 | 2.311 | 7.068 | 8.649 | −0.90% | −0.31% | 5.113 | 92.98% |
| C | Baseline | 1.330 | 1.387 | 5.034 | 5.226 | — | — | 4.612 | 96.06% |
| | SPSO | 1.311 | 1.363 | 4.944 | 5.139 | 1.60% | 1.72% | 4.825 | 97.15% |
| | FS | 1.332 | 1.384 | 4.981 | 5.224 | 0.06% | 0.54% | 7.612 | 89.83% |
| | BE | 1.335 | 1.353 | 5.016 | 5.111 | 1.09% | 1.29% | 5.049 | 96.23% |
| | GA | 1.334 | 1.385 | 5.030 | 5.216 | −0.05% | 0.13% | 6.369 | 92.29% |
| | PSO | 1.335 | 1.387 | 4.994 | 5.225 | −0.16% | 0.41% | 5.650 | 93.92% |

In the above experimental example, various search algorithms are applied to experimental data of each layer, so that a marker layout having the highest fitness value is determined as a final layout.

Here, weights $\alpha$, $\beta$, $\gamma$ of a fitness function are set to be 0.45, 0.45, and 0.1, respectively.

Table 2 shows detailed test performance of a marker layout found by each of the listed overlay alignment algorithms.

As shown in Table 2, values of irregularity with respect to a baseline layout are measured as 4.736 in the case of layer A, 4.546 in the case of layer B, and 4.612 in the case of layer C.

Further, for the following analysis, these baseline values are used for values of $M_{full\ sampling}$ in calculation of SAI (irregularity) performance as defined in Equation 4.

"RMSE X" and "M3S X" represent overlay residuals measured along the x-axis, and "RMSE Y and M3S Y" represent overlay residuals measured along the y-axis.

RMSE ratio and M3S ratio indicate the improvement in performance of the marker layouts of the other algorithms compared to that of the baseline layout.

A second fitness item is a performance index comprehensively considering the numerical values of RMSE, M3S, and irregularity presented in Equation 12.

According to this experimental example, SPSO succeeds in finding a marker layout that provides better performance than that of the other search algorithms.

The SPSO layouts recorded fitness values of 97.16% in the case of layer A, 95.41% in the case of layer B, and 97.15% in the case of layer C. The fitness values obtained using SPSO are higher than those of marker layouts found by the other algorithms.

The other search algorithms fail to record significant quality improvement compared to the above.

Therefore, it may be understood that a search method may be adjusted in accordance with an objective of a given problem such as SPSO according to the present disclosure so as to find an improved marker layout.

Figure 6A:
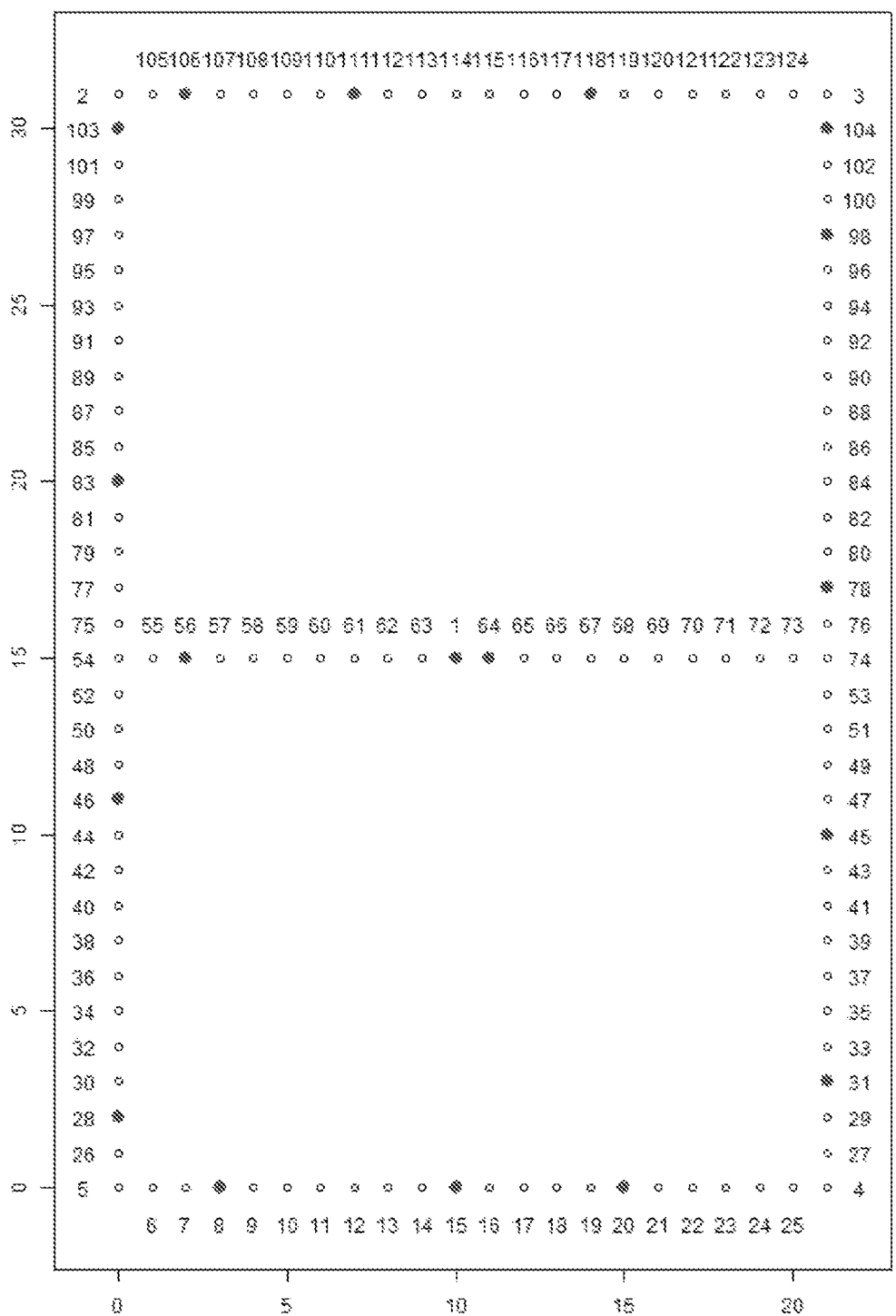
FIGS. 6A and 6B show a final marker layout of layer A obtained using a FS algorithm and a SPSO algorithm, respectively.
Figure 6B:
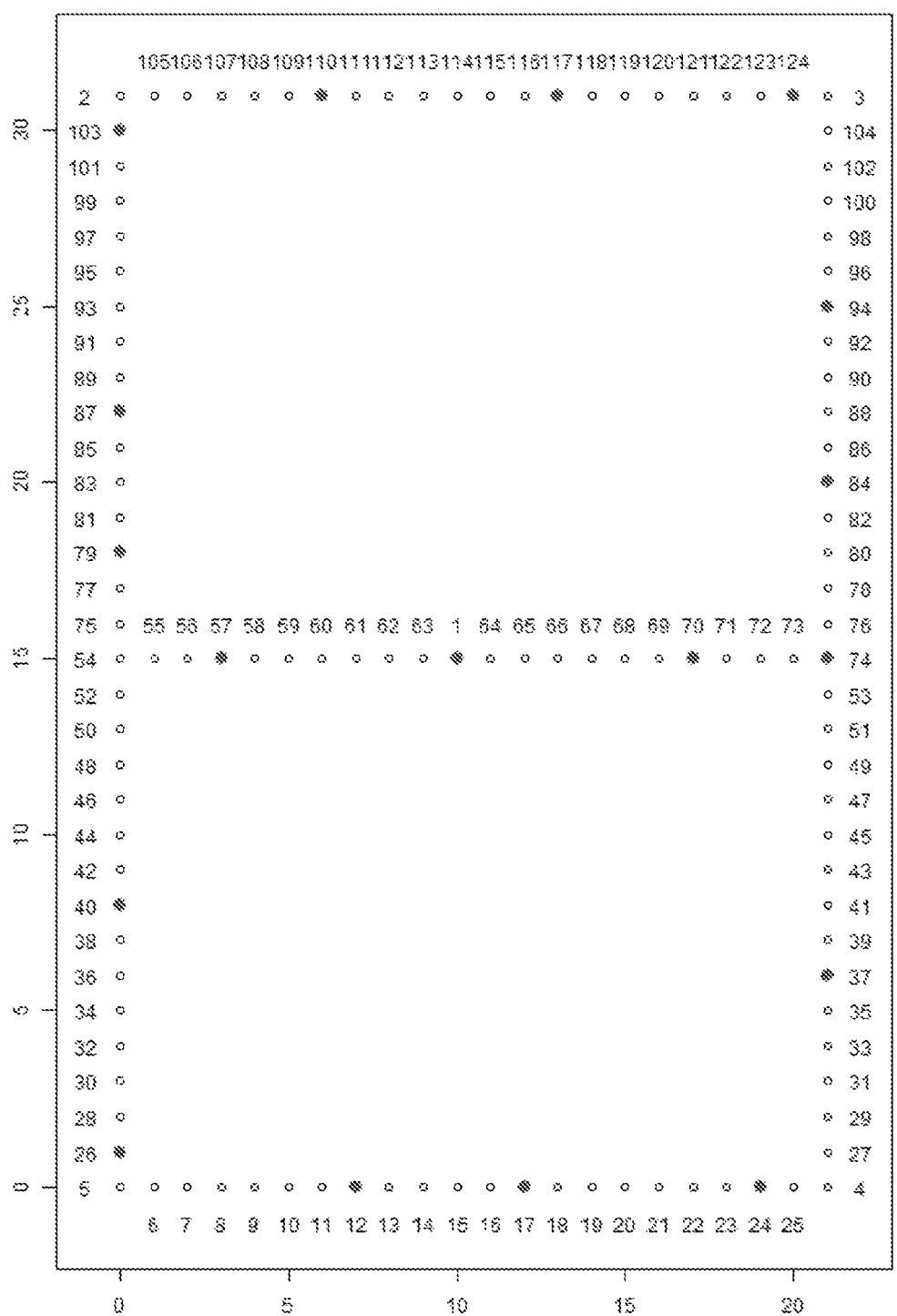

FIGS. 6A and 6B show a final marker layout of layer A obtained using a FS algorithm and a SPSO algorithm, respectively.

Figure 7A:
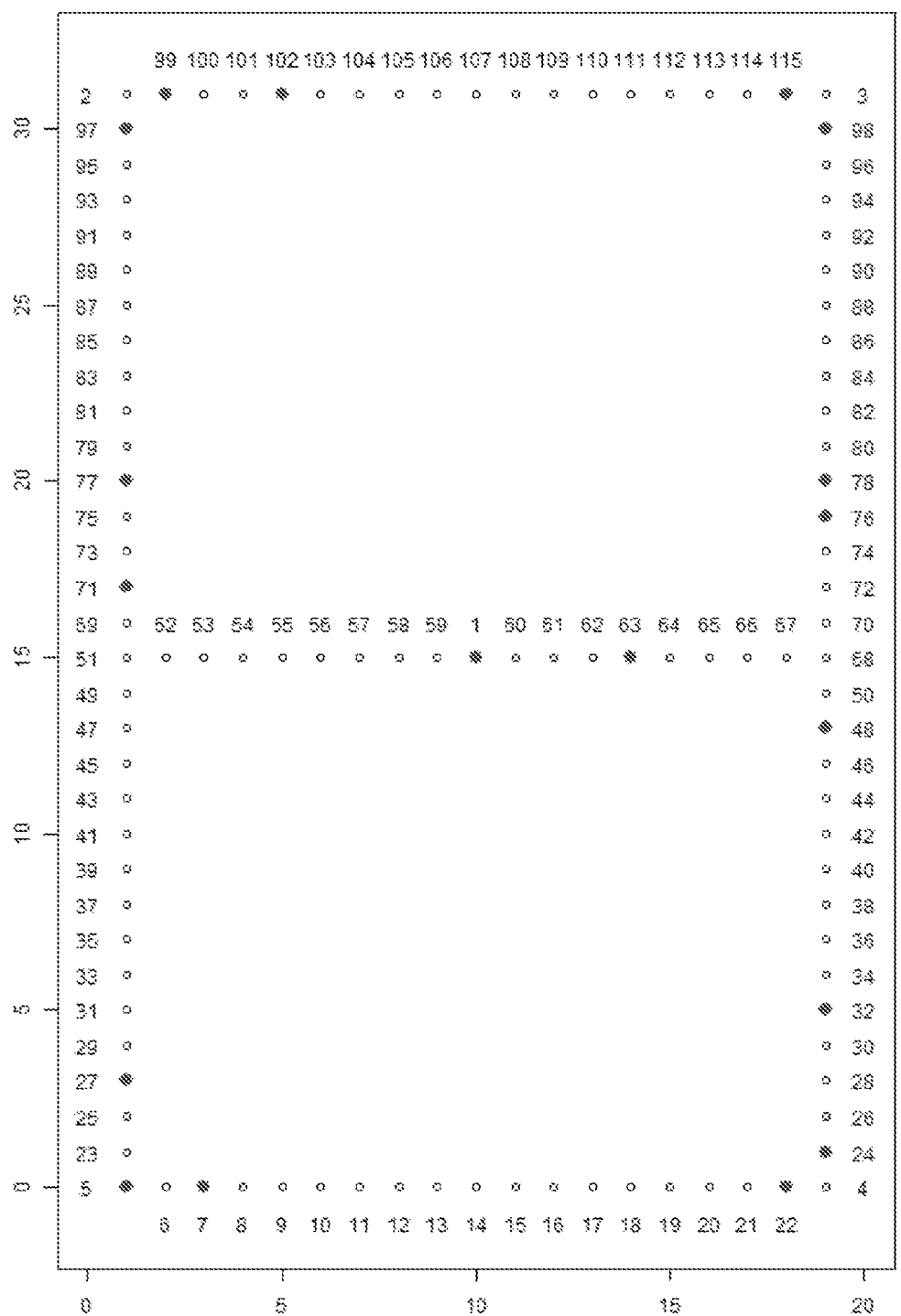
FIGS. 7A and 7B show a final marker layout of layer B obtained using a FS algorithm and a SPSO algorithm, respectively.
Figure 7B:
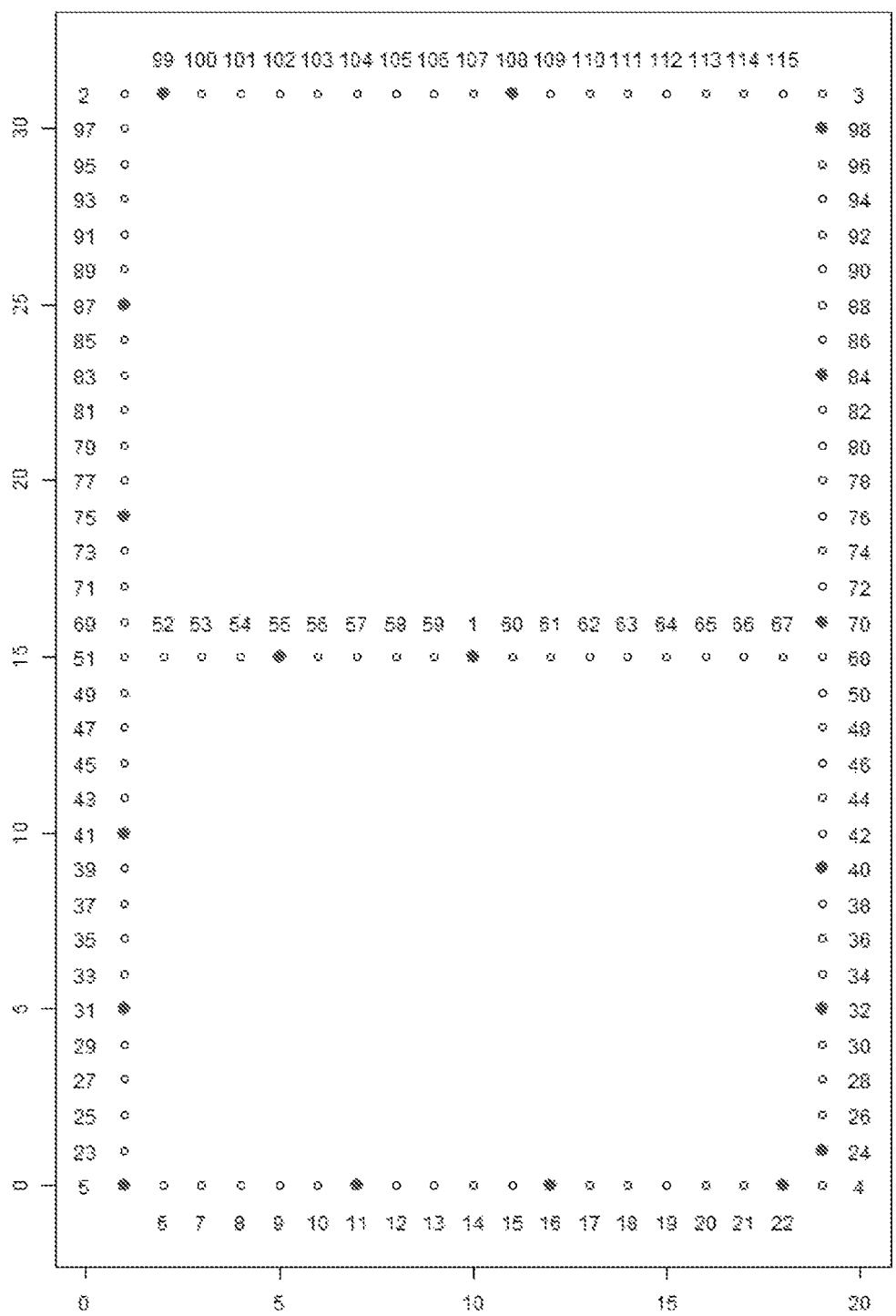

FIGS. 7A and 7B show a final marker layout of layer B obtained using a FS algorism and a SPSO algorithm, respectively.

Figure 8A:
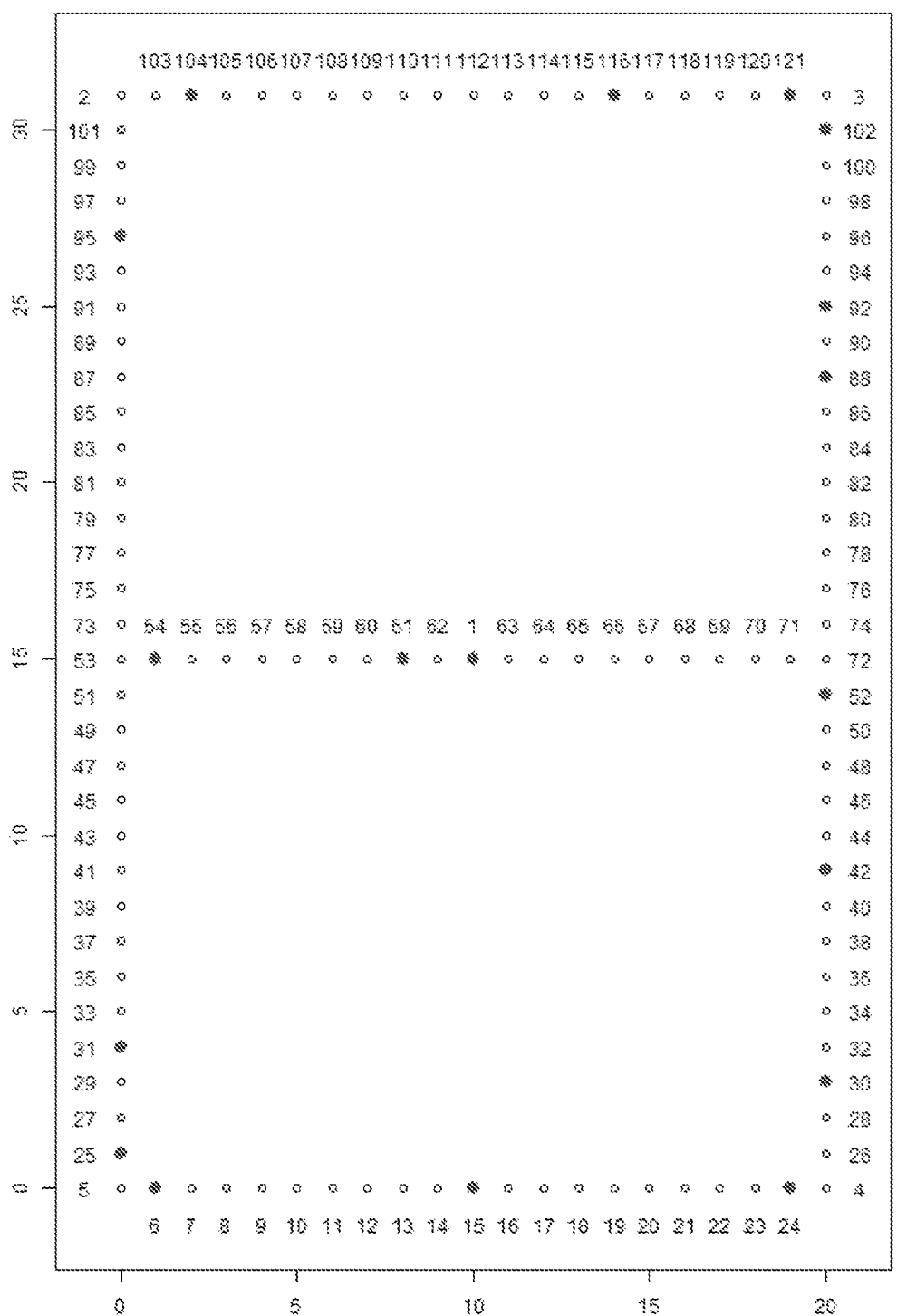
FIGS. 8A and 8B show a final marker layout of layer C obtained using a FS algorithm and a SPSO algorithm, respectively.
Figure 8B:
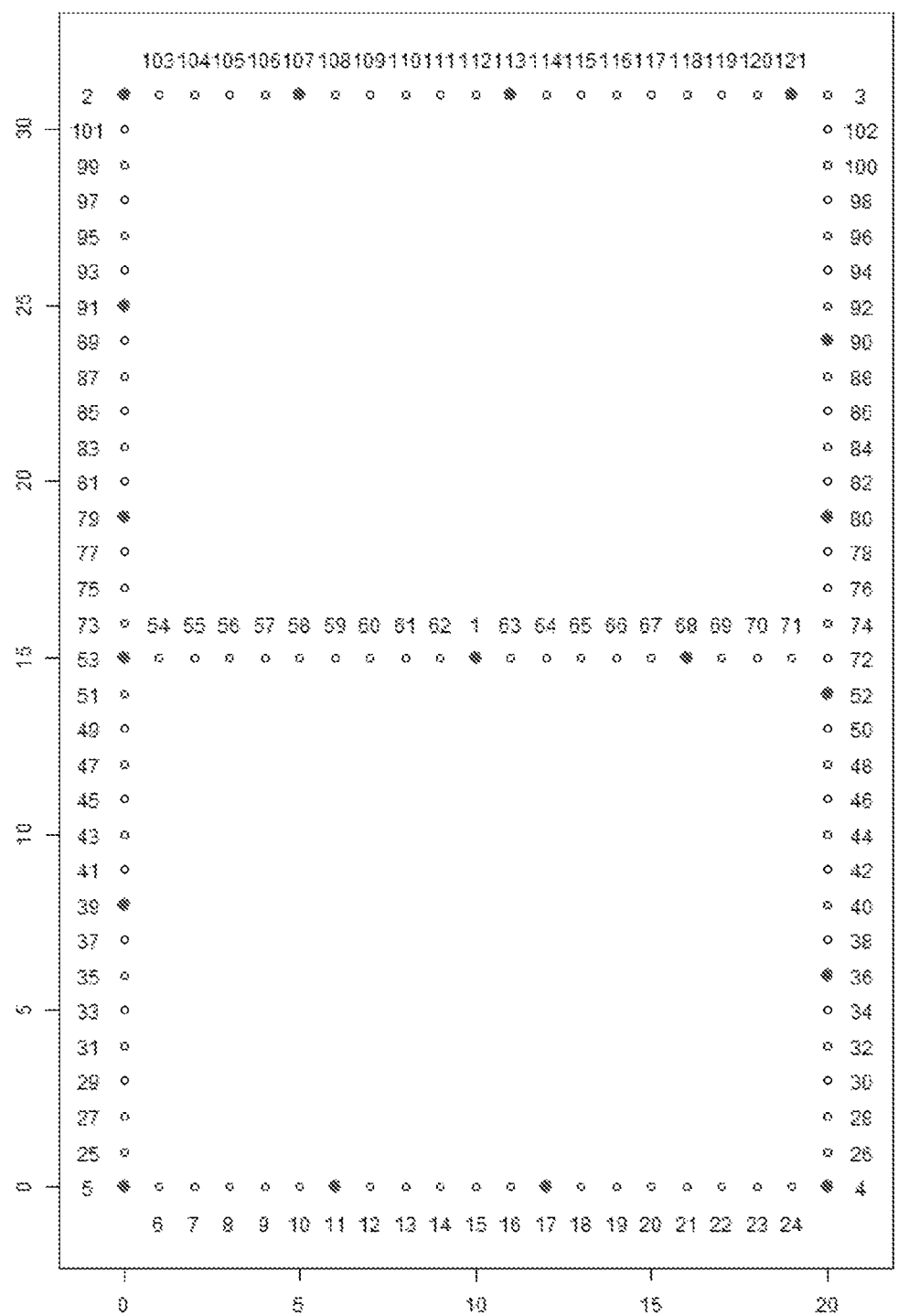

FIGS. 8A and 8B show a final marker layout of layer C obtained using a FS algorithm and a SPSO algorithm, respectively.

Regarding the FS-generated layout for layer B shown in FIG. 7A, 9 selected markers (5, 7, 22, 24, 27, 97, 98, 99, and 115) were located at corners, so that spacing between the selected markers was relatively wide and irregular. Notably, there is a problem in that there is no selected marker located in the middle of an outer horizontal axis (region [8, 21] and region [103, 114]).

In this case, even though the FS layout is effective with respect to given experimental data, it is uncertain whether this marker layout would perform well for new wafers whose an overlay errors may largely occur in regions where a marker is not located in an actual manufacturing process.

In contrast, among 9 edge-markers in the FS layout, only a subset of the corner-markers (5, 22, 24, 98, and 99) is included in the SPSO layout for layer B according to the present disclosure as shown in FIG. 7B, and the remaining selected markers are evenly distributed, maintaining adequate space overall.

Irregularity of the marker layout according to an embodiment of the present disclosure is low, so that even though a new wafer has an irregular overlay error in any region, the layout of SPSO may shows a reliable overlay correction effect.

Experimental data cannot reflect all that exceptional cases that may occur in an actual manufacturing process, so it may be preferable that the SPSO layout that may achieve low irregularity and excellent overlay correction performance at the same time according to the present disclosure should be introduced into a test wafer.

TABLE 3

| Layout | SAI(RMSE) | SAI(M3S) | SAI(irregularity) | Fitness |
|---|---|---|---|---|
| $\gamma = 0.01\ (\alpha = \beta = 0.495)$ | | | | |
| Baseline | 95.35% | 95.19% | 100% | 95.32% |
| SPSO | 96.33% | 96.54% | 97.08% | 96.44% |
| FS | 96.07% | 96.50% | 31.57% | 95.64% |
| BE | 95.66% | 95.65% | 65.82% | 95.36% |
| GA | 95.77% | 95.90% | 53.26% | 95.41% |
| PSO | 95.90% | 96.36% | 46.57% | 95.64% |
| $\gamma = 0.05\ (\alpha = \beta = 0.475)$ | | | | |
| Baseline | 95.35% | 95.19% | 100% | 95.51% |
| SPSO | 96.03% | 96.26% | 97.54% | 96.17% |
| FS | 96.05% | 96.49% | 34.56% | 93.18% |
| BE | 95.67% | 95.76% | 87.05% | 95.28% |
| GA | 94.68% | 95.21% | 73.99% | 93.90% |
| PSO | 94.92% | 95.27% | 79.04% | 94.16% |
| $\gamma = 0.1\ (\alpha = \beta = 0.45)$ | | | | |
| Baseline | 95.35% | 95.19% | 100% | 95.74% |
| SPSO | 96.40% | 96.69% | 96.87% | 96.58% |
| FS | 95.97% | 96.42% | 36.02% | 90.18% |
| BE | 95.46% | 95.59% | 89.92% | 94.96% |
| GA | 94.72% | 94.94% | 76.44% | 92.99% |
| PSO | 95.09% | 95.41% | 77.25% | 93.45% |
| $\gamma = 0.15\ (\alpha = \beta = 0.425)$ | | | | |
| Baseline | 95.35% | 95.19% | 100% | 95.98% |
| SPSO | 95.72% | 96.06% | 100% | 96.51% |
| FS | 95.57% | 96.08% | 39.19% | 87.33% |
| BE | 95.26% | 95.43% | 91.59% | 94.78% |
| GA | 94.10% | 94.31% | 79.64% | 92.02% |
| PSO | 94.43% | 94.86% | 81.01% | 92.60% |
| $\gamma = 0.2\ (\alpha = \beta = 0.4)$ | | | | |
| Baseline | 95.35% | 95.19% | 100% | 96.22% |
| SPSO | 95.57% | 95.94% | 100% | 96.60% |
| FS | 95.66% | 96.13% | 50.53% | 86.82% |
| BE | 95.26% | 95.42% | 91.81% | 94.63% |
| GA | 94.97% | 95.18% | 79.11% | 91.88% |
| PSO | 94.74% | 95.13% | 81.73% | 92.30% |

Table 3 relates to a result value of an experiment, which was performed in order to test generality of a search algorithm as weights ($\alpha$, $\beta$, $\gamma$) with respect to a fitness function are changed.

In Table 3, an average test result with respect to a marker layout of layers A, B, and C is summarized.

Here, a ratio $\gamma$ was gradually increased from 0.01 to 0.2 in a fitness function. As the ratio $\gamma$ was increased, irregularity became a primary factor of the layout quality assessment.

In contrast, performance of RMSE and M3S deteriorated to some extent.

Particularly, when $\gamma$ was 0.01, it is shown that marker layouts derived as a result of all of search algorithms have a similar fitness value of 95% or more.

However, as the value of $\gamma$ was increased, the gap between fitness values of the SPSO layout and the other layouts gradually increased.

That is, based on this experiment, it may be seen that the more irregularity is considered as the primary factor, the more an advantage of the SPSO layout according to the present disclosure is highlighted.

Also, the SPSO layout achieves the best fitness in all of test experiments regardless of the ratio of $\gamma$.

When a value of $\gamma$ is greater than 0.15, the SPSO layout shows better quality than that of the baseline layout in all performance measures such as SAI (RMSE), SAI (M3S), and SAI (irregularity).

Particularly, it is a significantly meaningful result that the marker layout of SPSO achieves 100% of SAI (irregularity), which means that the SPSO layout is better than the baseline layout since the SPSO layout has a lower numerical value of irregularity than that of the baseline layout.

The SAI (irregularity) is calculated based on irregularity of a baseline marker layout wherein markers of this layout are located manually in accordance with rules of field engineers.

Therefore, generally, it is significantly difficult that a search algorithm generates a marker layout having the same level of irregularity as that of a baseline.

Actually, a maximum value of SAI (irregularity) of the other search algorithms excluding SPSO is merely 91.81%.

In contrast, SPSO proves the superiority of the SPSO algorithm by finding a marker layout having better irregularity than that of the baseline.

Therefore, this experiment demonstrates that using the SPSO algorithm according to the present disclosure a better effect than that of the baseline may be obtained in regard to 1) overlay correction ability, 2) reliability of a marker layout, and 3) automatic optimization of a marker layout.

As the above, the present disclosure provides a SPSO algorithm that may effectively search for an excellent marker layout in a semiconductor photolithography process.

The SPSO algorithm according to the present disclosure employs a data-based approach to evaluate performance of a potential solution based on an experiment and test data.

One of important matters to be considered in this approach is to avoid a risk of overfitting when given a limited amount of training data. Data collected in a semiconductor manufacturing process may not generally reflect all of possible situations due to a dynamic nature of a process condition.

Therefore, despite some marker layouts being excellent with respect to test data, those marker layouts may not maintain their performance in an actual production stage.

In order to overcome this problem, the SPSO algorithm according to the present disclosure provides a method for quantifying a level of a risk that a marker layout is overfitted to training data, by means of creating an irregularity index for evaluating whether a marker layout is overfitted to the collected data or not.

Also, the SPSO algorithm is designed to maximize sparsity among markers by considering the locations of the markers as part of a marker layout search process.

In this process, each time a marker is selected, the selection probability of the markers is updated in consideration of a distance among markers. Based on this, a concentration of markers in one region may be prevented, and therefore, this marker layout shows better irregularity than that of competitive layouts.

Particularly, if the ratio of irregularity has a large weight in an objective function such as a fitness function, the experimental result presented herein demonstrate that the SPSO layout may outperform the existing baseline layout in all measures.

In the examples of the present disclosure, it is assumed that all fields of a wafer have the same layout, but the present disclosure is not limited thereto.

Embodiments may generate an intrinsic layout for each field or each of a plurality of areas of a wafer, for example, for each of a center and an edge of a wafer.

Also, even if there are constraints on the locations of marker in a field, the SPSO algorithm may search for an optimal marker layout according to the same procedure without further modification of the algorithm.

If some portion of a field is restricted from the allocation of markers due to preprocess or postprocess constraints, it may be very burdensome to determine a marker layout using heuristics based on the existing expert's knowledge. However, the SPSO algorithm according to the present disclosure may investigate an optimal marker layout in all kinds of marker layouts by means of using a data-based approach without additional changes.

The SPSO algorithm according to the present disclosure may be summarized as follows.

The present disclosure is directed to a photolithography process for transferring a pattern on a mask onto a wafer, and provides an algorithm for optimizing a marker layout per field.

An overlay metrology installation of the photolithography process selects markers at specific locations on a wafer (i.e., the sampling markers) and measures an overlay error based on marker information of the selected markers in order to transfer a mask pattern onto an exact location.

Thereafter, based on collected overlay error information, an overlay correction model is established and a location for pattern transfer is finally aligned.

Determining which locations are used to collect overlay information with respect to a whole wafer substantially affects the precision of the pattern alignment, and also correction is not possible once the location for pattern transfer is determined. Accordingly, determining which locations to use for overlay correction is an important problem directly affecting yield enhancement of a semiconductor manufacturing process.

The present disclosure may enhance yield of the photolithography process through optimization of the marker layout process.

In the present disclosure, a particle swarm optimization (PSO) process is improved according to a situation of the problem being addressed, so that a method for effectively finding an improved marker layout is presented.

Specifically, the present disclosure may generate an overlay marker layout according to a data-based method by applying a particle swarm optimization method in a semiconductor manufacturing field, evaluating the overlay marker layout with simulation, and determining an optimal solution.

In order to transform a real number solution generation method of the existing particle swarm optimization into a solution generation method for a marker layout in a process of searching for a marker layout, methodology according to the present disclosure may transform elements into probability by using a logistic function that incorporates an improved a softmax function, calculate a selection probability distribution of markers based on distance information, and select makers for sampling accordingly.

Specifically, in order to enhance search efficiency, in a process of generating an optimal layout, to generate one of the layouts that is a potential solution, as each new marker to be sampled is selected for inclusion in that layout, a selection probability distribution of the markers is updated using relative distance information between location information of markers already selected for inclusion in the layout and that of markers not selected yet.

This approach make a more effective search possible than that of the existing particle swarm optimization in a potential layout method generation process since a probability in that the markers are comparatively uniformly located on an overall wafer is increased.

Also, an embodiment of the present disclosure introduces a process of quantitatively evaluating the irregularity of a distribution of markers per field, so that it is systemized so that time consuming procedures and performance evaluation of a marker layout method determination process that previously may have required expert consultation may instead be performed automatically.

As the above, a solution generation method may be expanded and applied to the other optimization algorithms, for example, a genetic algorithm, a forward search method, a backward elimination method, and a reinforcement learning method etc.

Also, the experimental example demonstrates that a marker layout method generating through the optimized algorithm disclosed herein has excellent quality, this is, superior error correction ability and regularity compared to a marker layout method obtained using existing method or other heuristic methods.

Conventional marker layout methods may be divided into two types. A first type is a determination method of a layout method based on experts' knowledge, and a second type is a determination method of a marker layout method utilizing heuristic rule-based sampling.

The above methods determine a marker layout method based on experiential knowledge about a marker layout, and do not try to approach optimization on a basis of data-based problem solution procedures or a search for an optimal solution.

In contrast, an algorithm disclosed herein mathematizes and utilizes experts' experience or rules in a search process to determine a marker layout, so that a data-based optimal layout search process and quality inspection procedures may proceed automatically.

In the case of a conventional determination method, a usable marker layout is varied in a photolithography process according to a produced product or a layer, so that a marker layout method should be newly determined every time.

In contrast, for an algorithm disclosed herein, if only information about an overlay error of a usable marker, a marker location, and the number of the selected markers per field is given, a search may automatically proceed in any marker layout situations so as to find an optimal marker layout.

Even when there are limitations in a layout method determination process of a marker layout, for example, when there is a limitation regarding an available region for a marker, or there is a situation wherein a number of a usable markers per installation may be varied, it is possible to find an optimal marker layout using the SPSO algorithm according to the present disclosure without modification.

Also, the SPSO algorithm according to the present disclosure develops a quantitative indication of marker distribution per field and inserts the quantitative indication into an objective equation of a search process, so that a marker layout having excellent performance and robustness may be systematically and automatically found.

In addition, a process of finding a marker layout using the SPSO algorithm according to the present disclosure may contribute to realization of yield enhancement compared to other optimization algorithms.

A process of determining a marker layout in the existing photolithography process has previously been determined by consultation among field engineers without specific experimental and scientific inspection procedures.

However, as a semiconductor market continuously advances, investment for research and development is increased, and new experimental data is accumulated, providing opportunities to develop new analytic techniques and algorithms.

The problem of optimization for a marker layout method is a representative example of how the SPSO algorithm disclosed herein may be applied.

Data has been secured by performing experiments regarding new forms of process advancement at the center of an essential manufacturing process, but approaches and algorithms for analyzing this data to prepare grounds for making a decision and drawing a conclusion have been lacking.

The algorithm according to the present disclosure enhances a general optimization algorithm according to a particular situation of a problem with respect to a marker layout optimization problem of the photolithography process, and presents an improved approach to an optimization search process regarding the logic at the center of the algorithm. In this way, it has been experimentally confirmed that efficiency of an overall search procedure may be enhanced and quality of a final marker layout method may be improved.

The algorithm disclosed herein may be applied not only to an optimization problem involving dozens of layers that is solved to find an optimum solution for producing a semiconductor product, but also provides a scientific and experimental basis for decision making that currently depends on field engineers' experiences. Accordingly, high demand and marketability are predicted.

Particularly, as leading semiconductor manufacturing companies continuously increase research and development and installation investment so as to maximize production yield, there is technical demand for the content of the present disclosure.

As the above, the present disclosure has been described with reference to the embodiments illustrated in the drawings. However, it is obvious that the disclosure may be replaced, modified and changed by one having ordinary skill in the art to which the disclosure pertains in various different forms within the scope of the technical spirit of the disclosure. Therefore, the disclosure is not limited to the embodiments and the drawings set forth herein. In addition, even though action and effects according to configuration of the present disclosure are not definitely described in the description of embodiments of the present disclosure, it is certain that predictable effects resulted from the relevant configuration should be also admitted.

What is claimed is:

1. A method for determining a marker layout of a semiconductor device, comprising:
   determining a number of sampling markers to be used in a field by using a first fitness function, the field being one of a plurality of fields of a wafer, and the number of sampling markers being less than a total number of markers located in the field;
   calculating a marker probability distribution using distance information among the plurality of markers located in the field, and selecting a sampling marker for inclusion in a final marker layout from among the markers located in the field using the marker probability distribution; and evaluating a quality of the final marker layout using a second fitness function, wherein the first fitness function corresponds to:

first fitness=α×SAI(RMSE)+β×SAI(M3S)

wherein SAI corresponds to a sampling accuracy indicator function that indicates a degree to which a measure approximates a measure produced using full sampling, RMSE corresponds to a root mean squared error of a marker layout being evaluated, M3S corresponds to a Mean+3 Sigma measure of the marker layout being evaluated, and α and β are weighting constants.

2. The method of claim 1, wherein determining the number of sampling markers is performed using a forward selection search method that starts with a marker layout of an empty set and picks a best marker one at a time until all of markers are included, and wherein the best marker means a marker that shows a highest improvement in the first fitness function when each of that markers is added to the marker layout of an existing step.

3. The method of claim 2, wherein $$RMSE = \sqrt{\frac{1}{n}\sum_{i=1}^{n} (y_i^{res})^2},$$

$$M3S = \text{Mean}(y^{res}) + 3\sigma(y^{res}), \text{ and}$$

$$SAI = 1 - \frac{|M_{selected} - M_{full\ sampling}|}{M_{full\ sampling}},$$

wherein $y_i^{res}=\hat{y}_i-y_i$, $y_i$ is an actual overlay value evaluated at marker i, $\hat{y}_i$ is a prediction value at a marker, $y_i^{res}$ is an overlay residual, Mean($y^{res}$) is the average of the overlay residuals $y_i^{res}$ for i in 1 ... n, $\sigma(y^{res})$ is the standard deviation of the overlay residuals $y_i^{res}$ for i in 1 ... n, $M_{selected}$ is a root mean squared error (RMSE) or Mean+3 sigma (M3S) or irregularity which is a measure of an overlay error according to a selected marker, and $M_{full\ sampling}$ is a RMSE or M3S or irregularity which is a measure of an overlay error according to full sampling schemes.

4. The method of claim 1, wherein calculating a marker probability distribution using distance information among the plurality of markers located in the field, and selecting a sampling marker for inclusion in a final marker layout from among the markers located in the field using the marker probability distribution determining the number of sampling markers is performed using a backward elimination search method that starts with an universal set which includes all of markers and removes a marker that shows a least impact on the first fitness function one at a time until a marker layout reaches an empty set.

5. The method of claim 4, wherein $$RMSE = \sqrt{\frac{1}{n}\sum_{i=1}^{n} (y_i^{res})^2},$$

$$M3S = \text{Mean}(y^{res}) + 3\sigma(y^{res}), \text{ and}$$

$$SAI = 1 - \frac{|M_{selected} - M_{full\ sampling}|}{M_{full\ sampling}},$$

wherein $y_i^{res}=y_i-\hat{y}_i$, $y_i$ is an actual overlay value evaluated at marker i, $\hat{y}_i$ is a prediction value at a marker, $y_i^{res}$ is an overlay residual, Mean($y^{res}$) is the average of the overlay residuals $y_i^{res}$ for i in 1 ... n, $\sigma(y^{res})$ is the standard deviation of the overlay residuals $y_i^{res}$ for i in 1 ... n, $M_{selected}$ is a root mean squared error (RMSE) or Mean+3 sigma (M3S) or irregularity which is a measure of an overlay error according to a selected marker, and $M_{full\ sampling}$ is a RMSE or M3S or irregularity which is a measure of an overlay error according to full sampling schemes.

6. The method of claim 1, wherein α+β=1.

7. The method claim 6, wherein $$RMSE = \sqrt{\frac{1}{n}\sum_{i=1}^{n} (y_i^{res})^2},$$

$$M3S = \text{Mean}(y^{res}) + 3\sigma(y^{res}), \text{ and}$$

$$SAI = 1 - \frac{|M_{selected} - M_{full\ sampling}|}{M_{full\ sampling}},$$

wherein $y_i^{res}=y_i-\hat{y}_i$, $y_i$ is an actual overlay value evaluated at marker i, $\hat{y}_i$ is a prediction value at a marker, $y_i^{res}$ is an overlay residual, Mean($y^{res}$) is the average of the overlay residuals $y_i^{res}$ for i in 1 ... n, $\sigma(y_{res})$ is the standard deviation of the overlay residuals $y_i^{res}$ for i in 1 ... n, $M_{selected}$ is a root mean squared error (RMSE) or Mean+3 sigma (M3S) or irregularity which is a measure of an overlay error according to a selected marker, and $M_{full\ sampling}$ is a RMSE or M3S or irregularity which is a measure of an overlay error according to full sampling schemes.

8. The method of claim 1, wherein the second fitness function corresponds to:

second fitness=α×SAI(RMSE)+×SAI(M3S)+γ×SAI (irregularity), wherein SAI corresponds to a sampling accuracy indicator function that indicates a degree to which a measure approximates a measure produced using full sampling, RMSE corresponds to a root mean squared error of a marker layout being evaluated, M3S corresponds to a Mean+3 Sigma measure of the marker layout being evaluated, α, β, and γ are weighting constants, and irregularity is defined as $$\text{irregularity} = \frac{1}{n}\sum_{i=1}^{n}(\text{dist}(l_i, n\_l_i))^2,$$

wherein $l_i$ is a marker location (i=1, ... , n), and $n\_l_i$ is a location of a nearest neighboring marker in a selected marker set, and n is a number of markers in the final marker layout.

9. The method of claim 8, wherein α+β+γ=1.

10. The method of claim 8, wherein $$RMSE = \sqrt{\frac{1}{n}\sum_{i=1}^{n} (y_i^{res})^2},$$

-continued $$M3S = \text{Mean}(y^{res}) + 3\sigma(y^{res}), \text{ and}$$

$$SAI = 1 - \frac{|M_{selected} - M_{full\ sampling}|}{M_{full\ sampling}},$$

wherein $y_i^{res} = y_i - \hat{y}_i$, $y_i$ is an actual overlay value evaluated at marker i, $\hat{y}_i$ is a prediction value at a marker, $y_i^{res}$ is an overlay residual, $\text{Mean}(y^{res})$ is the average of the overlay residuals $y_i^{res}$ for i in 1 ... n, $\sigma(y^{res})$ is the standard deviation of the overlay residuals $y_i^{res}$ for i in 1 ... n, $M_{selected}$ is a root mean squared error (RMSE) or Mean+3 sigma (M3S) or irregularity which is a measure of an overlay error according to a selected marker, and $M_{full\ sampling}$ is a RMSE or M3S or irregularity which is a measure of an overlay error according to full sampling schemes.

11. A method for determining a marker layout of a semiconductor device, comprising:
   determining a number of sampling markers to be used in a field by using a first fitness function, the field being one of a plurality of fields of a wafer, and the number of sampling markers being less than a total number of markers located in the field;
   calculating a marker probability distribution using distance information among the plurality of markers located in the field, and selecting a sampling marker for inclusion in a final marker layout from among the markers located in the field using the marker probability distribution; and
   evaluating a quality of the final marker layout using a second fitness function,
   wherein calculating the marker probability distribution and selecting the sampling marker for inclusion in the final marker layout includes:
   when selecting a first marker for inclusion in the final marker layout, a value of the marker probability distribution is determined by $$p_i = \frac{1}{1 + \exp(-x_i)}, \text{ where } 1 \leq i \leq N,$$

wherein $x_i$ (i=1, ..., N) is a real number.

12. A method for determining a marker layout of a semiconductor device, comprising:
   determining a number of sampling markers to be used in a field by using a first fitness function, the field being one of a plurality of fields of a wafer, and the number of sampling markers being less than a total number of markers located in the field;
   calculating a marker probability distribution using distance information among the plurality of markers located in the field, and selecting a sampling marker for inclusion in a final marker layout from among the markers located in the field using the marker probability distribution; and
   evaluating a quality of the final marker layout using a second fitness function,
   wherein calculating the marker probability distribution and selecting the sampling marker for inclusion in the final marker layout includes:
   when selecting a location of a second marker or a subsequent marker for inclusion in the final marker layout, a value of the marker probability distribution is determined by $$\tilde{p}_i = \frac{e^{d_i p_i} - 1}{\sum_{i=1}^{n}(e^{d_i p_i} - 1)}, \text{ where } 1 \leq i \leq N,$$

wherein $d_i$ is a minimum value of distances between an i-th currently unselected marker and previously selected markers.

* * * * *